(12) United States Patent
Chang et al.

(10) Patent No.: US 11,903,236 B2
(45) Date of Patent: Feb. 13, 2024

(54) DISPLAY DEVICE INCLUDING MULTI-RECESS SURROUNDING MODULE HOLE

(71) Applicant: Samsung Display Co., Ltd., Yongin-si (KR)

(72) Inventors: Moonwon Chang, Yongin-si (KR); Seunghun Kim, Hwaseong-si (KR); Woo Yong Sung, Seoul (KR); Sooyoun Kim, Siheung-si (KR); Junghan Seo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 374 days.

(21) Appl. No.: 17/265,336

(22) PCT Filed: Apr. 5, 2019

(86) PCT No.: PCT/KR2019/004114
§ 371 (c)(1),
(2) Date: Feb. 2, 2021

(87) PCT Pub. No.: WO2020/027404
PCT Pub. Date: Feb. 6, 2020

(65) Prior Publication Data
US 2021/0320276 A1    Oct. 14, 2021

(30) Foreign Application Priority Data

Aug. 2, 2018   (KR) .......................... 10-2018-0090372

(51) Int. Cl.
*H10K 59/84*       (2023.01)
*H10K 59/00*       (2023.01)
(Continued)

(52) U.S. Cl.
CPC ......... *H10K 50/841* (2023.02); *H10K 50/844* (2023.02); *H01L 27/14678* (2013.01);
(Continued)

(58) Field of Classification Search
CPC .... H10K 50/841; H10K 50/844; H10K 50/84; H10K 59/124; H10K 59/00; H10K 59/12;
(Continued)

(56) References Cited

U.S. PATENT DOCUMENTS 9,825,103 B2    11/2017  Rappoport et al.
10,205,122 B2 *  2/2019  Choi .................... H10K 50/844
(Continued)

FOREIGN PATENT DOCUMENTS

CN        107579171 A    1/2018
CN        109845406 A    6/2019
(Continued)

*Primary Examiner* — Ida M Soward
(74) *Attorney, Agent, or Firm* — Lewis Roca Rothgerber Christie LLP

(57) ABSTRACT

A display device includes: a base substrate including a front surface and a rear surface, and including a display region and a peripheral region adjacent to the display region in a plan view; an organic light-emitting element on the display region; and a sealing layer on the organic light-emitting element. The base substrate includes: a module hole in the display region, and passing through the front surface and the rear surface; a first recess at the display region and recessed from the front surface, the first recess surrounding the module hole in the plan view; and a second recess at the display region and recessed from the front surface, the second recess surrounding the first recess in the plan view. The first recess and the second recess have different widths from each other in a direction parallel to the front surface.

20 Claims, 13 Drawing Sheets

(51) Int. Cl.
*H10K 59/12* (2023.01)
*H10K 50/84* (2023.01)
*H10K 50/844* (2023.01)
*H10K 59/124* (2023.01)
*H10K 77/10* (2023.01)
*H01L 27/146* (2006.01)
*H10K 102/00* (2023.01)

(52) U.S. Cl.
CPC .............. *H10K 50/84* (2023.02); *H10K 59/00* (2023.02); *H10K 59/12* (2023.02); *H10K 59/124* (2023.02); *H10K 77/111* (2023.02); *H10K 2102/311* (2023.02); *H10K 2102/351* (2023.02)

(58) Field of Classification Search
CPC ............ H10K 77/111; H10K 2102/311; H10K 2102/351; H10K 27/14678
See application file for complete search history.

(56) References Cited

U.S. PATENT DOCUMENTS

| | | |
|---|---|---|
| 10,431,772 B2 | 10/2019 | Choi et al. |
| 10,743,425 B2 | 8/2020 | Park et al. |
| 10,797,266 B2 | 10/2020 | Choi et al. |
| 2014/0027791 A1 | 1/2014 | Cho et al. |
| 2016/0202515 A1 | 7/2016 | Watanabe et al. |
| 2017/0026553 A1 | 1/2017 | Lee et al. |
| 2017/0110532 A1* | 4/2017 | Kim ...................... H10K 59/124 |
| 2017/0148856 A1 | 5/2017 | Choi |
| 2017/0162637 A1* | 6/2017 | Choi ........................ G09G 3/20 |
| 2018/0151834 A1 | 5/2018 | Kanaya |
| 2018/0159075 A1 | 6/2018 | Kim et al. |
| 2019/0051859 A1* | 2/2019 | Choi .................... H10K 59/123 |
| 2019/0148672 A1* | 5/2019 | Seo ...................... H10K 50/856 257/40 |
| 2019/0334120 A1 | 10/2019 | Seo et al. |
| 2020/0020752 A1 | 1/2020 | Shi et al. |
| 2020/0035950 A1* | 1/2020 | Seo ........................ H10K 59/65 |
| 2020/0043997 A1 | 2/2020 | Sonoda et al. |
| 2021/0359269 A1* | 11/2021 | Seo .................... H10K 50/8445 |

FOREIGN PATENT DOCUMENTS

| | | |
|---|---|---|
| EP | 3678206 A1 | 7/2020 |
| JP | 2018-87863 A | 6/2018 |
| JP | 2020-531881 A | 11/2020 |
| KR | 10-2014-0014525 A | 2/2014 |
| KR | 10-2017-0059864 A | 5/2017 |
| KR | 10-2017-0095444 A | 8/2017 |
| KR | 10-2018-0048247 A | 5/2018 |
| KR | 10-2018-0062155 A | 6/2018 |
| KR | 10-2018-0063962 A | 6/2018 |
| KR | 10-2019-0126016 A | 11/2019 |
| WO | 2018/066038 A1 | 4/2018 |
| WO | 2019/042340 A1 | 3/2019 |

* cited by examiner

DISPLAY DEVICE INCLUDING MULTI-RECESS SURROUNDING MODULE HOLE

CROSS-REFERENCE TO RELATED APPLICATIONS

This application is a U.S. National Phase Patent Application of International Application No. PCT/KR2019/004114, filed on Apr. 5, 2019, which claims priority to Korean Patent Application No. 10-2018-0090372, filed on Aug. 2, 2018, the entire content of all of which is hereby incorporated by reference herein.

BACKGROUND

1. Field

Aspects of example embodiments of the present disclosure relate to a display panel and an electronic device including the same, and more particularly, to a display panel having an improved strength and an electronic device including the same.

2. Description of the Related Art

Recently, organic light-emitting display devices have been spotlighted as devices for displaying images. The organic light-emitting devices have high-quality characteristics, for example, such as low power consumption, high brightness, and high response speeds.

An organic light-emitting device includes an organic light-emitting element. The organic light-emitting element may be weak against moistures and/or oxygen, and thus, may be easily damaged. Accordingly, in the organic light-emitting device, as moisture and/or oxygen introduced from the outside are more stably blocked, the more the reliability and the service life of the organic light-emitting device are improved.

The above information disclosed in this Background section is for enhancement of understanding of the background of the present disclosure, and therefore, it may contain information that does not constitute prior art.

SUMMARY

One or more example embodiments of the present disclosure are directed to a display panel in which external contaminants are prevented or substantially prevented from being introduced therein, and an electronic device including the display panel.

One or more example embodiments of the present disclosure are directed to a display panel having improved mechanical strength, and an electronic device including the display panel.

According to one or more example embodiments of the present disclosure, a display device includes: a base substrate including a front surface and a rear surface, and comprising a display region and a peripheral region adjacent to the display region in a plan view; an organic light-emitting element on the display region of the base substrate; and a sealing layer on the organic light-emitting element. The base substrate includes: a module hole in the display region, and passing through the front surface and the rear surface of the base substrate; a first recess at the display region and recessed from the front surface of the base substrate, the first recess surrounding the module hole in the plan view; and a second recess at the display region and recessed from the front surface of the base substrate, the second recess surrounding the first recess in the plan view. The first recess and the second recess have different widths from each other in a direction parallel to the front surface of the base substrate.

In an example embodiment, the first recess may have a greater width than that of the second recess in the direction parallel to the front surface of the base substrate.

In an example embodiment, the second recess may have a greater width than that of the first recess in the direction parallel to the front surface of the base substrate.

In an example embodiment, the sealing layer may include an organic film that is filled in the second recess.

In an example embodiment, the organic film may not be filled in the first recess.

In an example embodiment, the sealing layer may further include: a first inorganic film between the organic light-emitting element and the organic film; and a second inorganic film on the organic film. The organic film may be between the first inorganic film and the second inorganic film at a region overlapping with the second recess.

In an example embodiment, in the plan view, a region between the first recess and the second recess may be defined as a first region, a region outside the second recess may be defined as a second region, a region between the first recess and the module hole may be defined as a third region, and a distance from the rear surface of the base substrate to an upper surface of the sealing layer in the first region may be greater than a distance from the rear surface of the base substrate to the upper surface of the sealing layer in the third region.

In an example embodiment, the display device may further include an insulating layer on the base substrate. The insulating layer may be located under the sealing layer in the first region, and may not be located in the third region.

In an example embodiment, the distance from the rear surface of the base substrate to the upper surface of the sealing layer in the first region may be smaller than a distance between the rear surface of the base substrate to the upper surface of the sealing layer in the second region.

In an example embodiment, the base substrate may further include a third blocking recess at the display region and recessed from the front surface of the base substrate, the third blocking recess being between the module hole and the first recess in the plan view; and the third blocking recess may have a smaller width than that of at least one of the first recess or the second recess in the direction parallel to the front surface of the base substrate.

In an example embodiment, in the plan view, a region between the first recess and the second recess may be defined as a first region, a region outside the second recess may be defined as a second region, a region between the first recess and the third blocking recess may be defined as a third region, a region between the third blocking recess and the module hole may be defined as a fourth region, and the fourth region may have a smaller minimum width than those of the first region and third region in the direction parallel to the front surface of the base substrate.

In an example embodiment, the sealing layer may cover an inner surface of the first recess, an inner surface of the second recess, the first region, and the second region.

In an example embodiment, the sealing layer may include: a first inorganic film; an organic film on the first inorganic film; and a second inorganic film on the organic film, and the first inorganic film and the second inorganic film may be in contact with each other in the first recess, and may be spaced apart from each other in the second recess.

In an example embodiment, the base substrate may include: a first base layer including an organic material, and configured to define the rear surface of the base substrate; a first barrier layer on the first base layer, the first barrier layer including an inorganic material, and configured to define the front surface of the base substrate; a second base layer between the first base layer and the first barrier layer, and including an organic material; and a second barrier layer between the first base layer and the first barrier layer, and including an inorganic material.

In an example embodiment, the module hole may pass through the first base layer, the second base layer, the first barrier layer, and the second barrier layer, and each of the first and second blocking recesses may be on the first base layer and the second barrier layer.

In an example embodiment, each of the first recess and the second recess may include: a through part passing through the first barrier layer; and a recessed part overlapping with the through part of the first barrier layer, and defined in the second base layer, and a width of the recessed part may be greater than a width of the through part of the first barrier layer.

In an example embodiment, in the plan view, the module hole may have a circular shape, and each of the first recess and the second recess may have a circularly annular shape.

According to one or more example embodiments of the present disclosure, a display device includes: a base substrate including a front surface and a rear surface, and comprising a display region and a peripheral region adjacent to the display region in a plan view; an organic light-emitting element on the display region of the base substrate; and a sealing layer on the organic light-emitting element. The base substrate includes: a module hole in the display region, and passing through the front surface and the rear surface of the base substrate; a first recess at the display region and recessed from the front surface of the base substrate, the first recess surrounding the module hole in the plan view; a second recess at the display region and recessed from the front surface of the base substrate, the second recess surrounding the first recess in the plan view; and a third blocking recess at the display region and recessed from the front surface of the base substrate, the third blocking recess being between the module hole and the first recess in the plan view. The third blocking recess has a smaller width than that of at least one of the first recess and the second recess in a direction parallel to the front surface of the base substrate.

According to one or more example embodiments of the present disclosure, a display device includes: a display panel including: a base substrate including a plurality of pixels; a front surface comprising a display region in which the pixels are located, and a peripheral region adjacent to the display region; and a rear surface opposite the front surface; and an electronic component connected to the display panel. The base substrate includes: a module hole in the display region, and passing through the front surface and the rear surface of the base substrate; a first recess at the display region and recessed from the front surface of the base substrate, the first recess surrounding the module hole in a plan view; and a second recess at the display region and recessed from the front surface of the base substrate, the second recess surrounding the first recess in the plan view. The electronic component is accommodated in the module hole, and the first recess and the second recess have different widths from each other in a direction parallel to the front surface of the base substrate.

In an example embodiment, the electronic component may include at least one from among any of an audio output device, an imaging device, or a light-receiving device.

According to one or more example embodiments of the present disclosure, damage caused by moisture and/or oxygen introduced from the outside may be prevented or substantially prevented. Accordingly, an electronic device having improved reliability in processes and uses may be provided.

According to one or more example embodiments of the present disclosure, the strength of a display panel, and an electronic device including the display panel, may be enhanced by preventing or reducing the occurrence of a crack in the inorganic films of a sealing layer.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1:
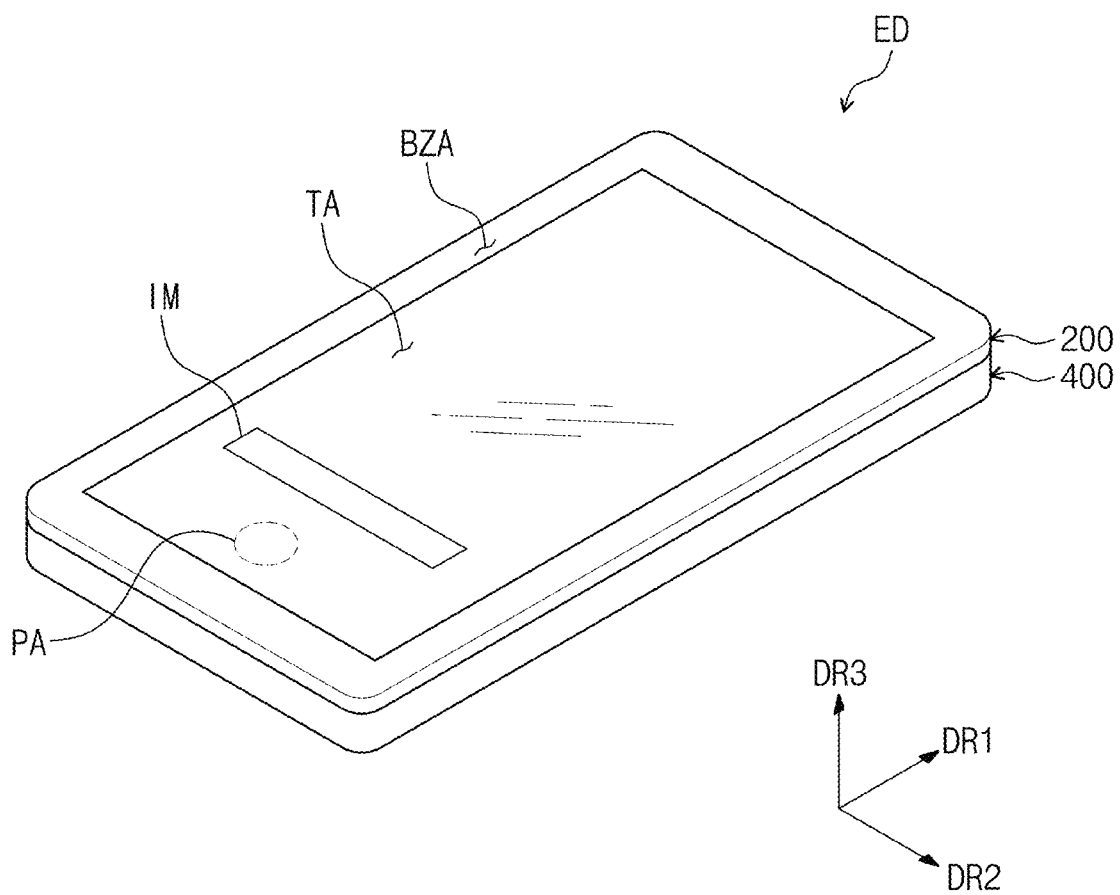
FIG. 1 is a perspective view of an electronic device according to an embodiment of the present disclosure.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
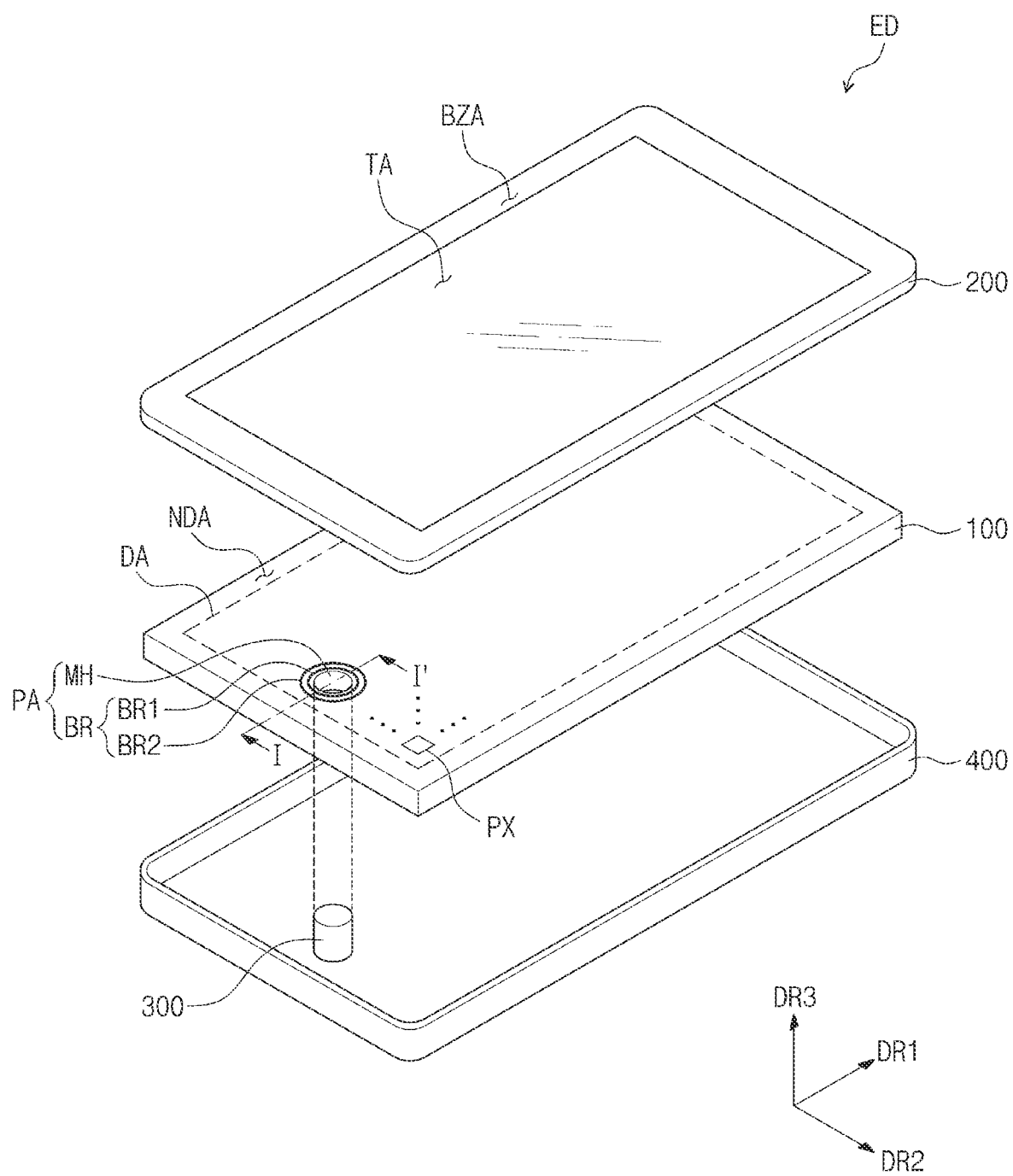
FIG. 2 is an exploded perspective view of the electronic device illustrated in FIG. 1.
Figure 3:
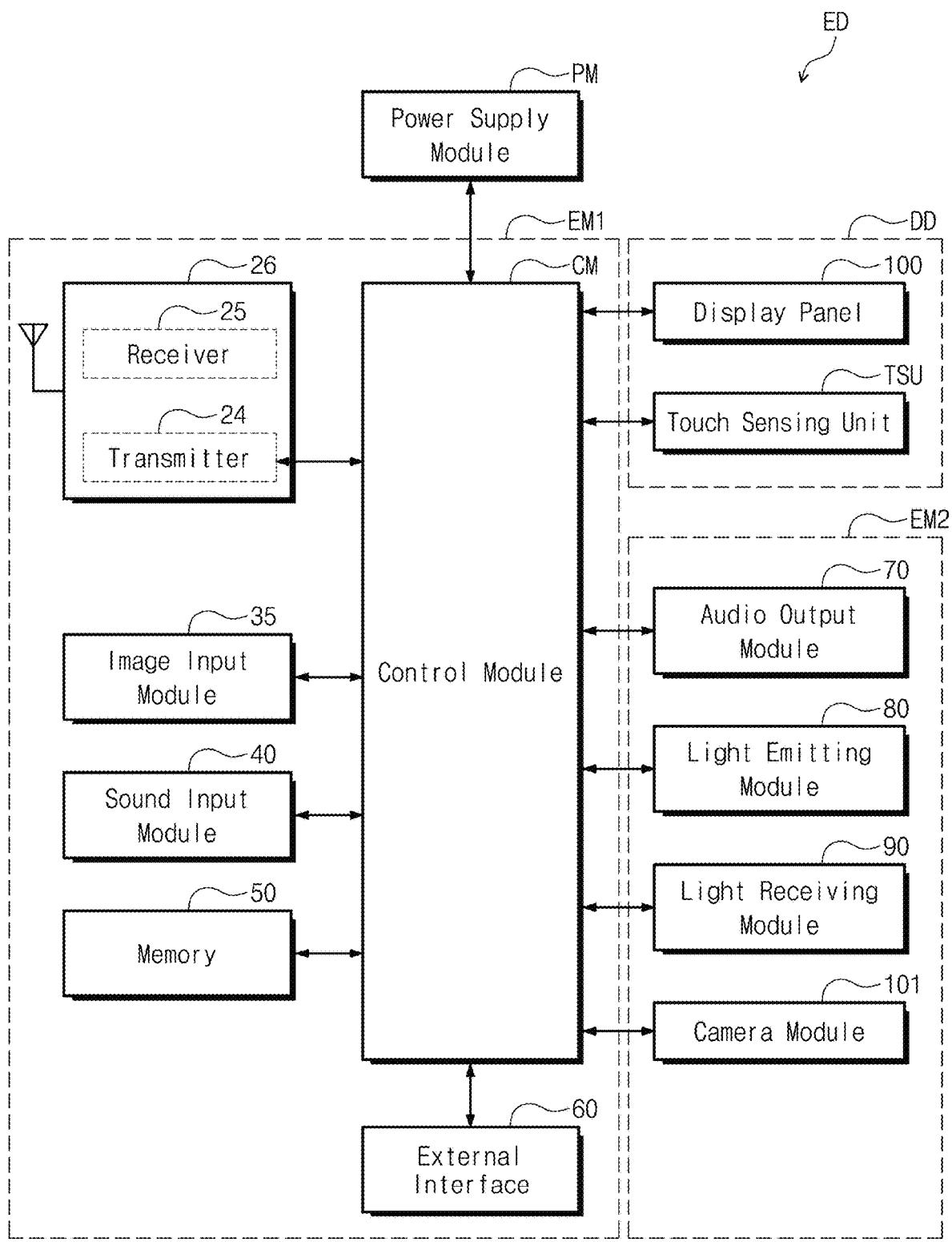
FIG. 3 is a block diagram of the electronic device illustrated in FIG. 1.

FIG. 1 is a perspective view of an electronic device according to an embodiment of the present disclosure. FIG. 2 is an exploded perspective view of the electronic device illustrated in FIG. 1. FIG. 3 is a block diagram of the electronic device illustrated in FIG. 1. Hereinafter, with reference to FIGS. 1 to 3, an electronic device ED according to an embodiment of the present disclosure will be described.

The electronic device ED may be a device that is activated in response to an electric signal. The electronic device ED may include various suitable embodiments. For example, the electronic device ED may be implemented as a tablet PC, a laptop PC, a smart television, and/or the like. As an example, in the embodiment of FIGS. 1 to 3, the electronic device ED is illustrated as a smartphone for convenience of illustration, but the present disclosure is not limited thereto.

As illustrated in FIG. 1, the electronic device ED may provide a display surface on the front surface thereof for displaying an image IM. The display surface may be defined as being parallel to or substantially parallel to a surface defined by a first direction DR1 and a second direction DR2. The display surface may include a display region DA (e.g., see FIG. 2), and a bezel region BZA adjacent to the display region DA.

The electronic device ED displays an image IM at (e.g., in or on) the display region DA. FIG. 1 shows an internet search window as an example of the image IM. The display region DA may have a rectangular shape that is parallel to or substantially parallel to each of the first direction DR1 and the second direction DR2. However, the present disclosure is not limited thereto, and the display region DA may have various suitable shapes, such that the shapes thereof are not limited to any one embodiment.

The bezel region BZA is adjacent to the display region DA. The bezel region BZA may surround (e.g., around a periphery of) the display region DA. However, the present disclosure is not limited thereto, and the bezel region BZA may be disposed adjacent to only one side of the display region DA, or may be omitted. An electronic device according to an embodiment of the present disclosure may include various suitable embodiments, and the embodiments thereof are not limited to any one embodiment.

The normal direction of the display surface may correspond to the thickness direction (e.g., DR3, hereinafter referred to as a third direction) of the electronic device ED.

In the embodiment of FIGS. 1 to 3, a front surface (or an upper surface) and a rear surface (or a lower surface) of each member, element, or layer are defined with respect to the direction in which the image IM is displayed. For example, the front surface and the rear surface of the electronic device ED may be opposite from (e.g., may face away from) each other in the third direction DR3.

However, the present disclosure is not limited to the directions shown in the figures, and the directions indicated by the first to third directions DR1, DR2, and DR3 have relative concepts such that they may be converted into other suitable directions. Hereinafter, the first to third directions DR1, DR2, and DR3 refer to directions indicated by the reference symbols DR1, DR2, and DR3, respectively, but the present disclosure is not limited to the first to third directions DR1, DR2, and DR3 shown in the figures, and the first to third directions DR1, DR2, and DR3 may refer to any suitable directions that cross each other.

As illustrated in FIGS. 1 to 3, the electronic device ED includes a display panel 100, a window 200, an electronic module (e.g., an electronic component) 300, and a housing 400. As illustrated in FIG. 3, the electronic device ED may further include a display module (e.g., a display device) DD, a first electronic module (e.g., a first electronic component) EM1, a second electronic module (e.g., a second electronic component) EM2, and a power supply module (e.g., a power supply) PM. FIG. 2 illustrates the constituents illustrated in FIG. 3 while omitting some constituents from among the constituents of FIG. 3.

The display module DD may include a display panel 100 and a touch sensing unit (e.g., a touch sensing layer or a touch sensing panel) TSU. The display panel 100 generates an image IM. In some embodiments, the display panel 100 may also sense an input of a user applied from the outside. In this case, the display panel 100 may further include a touch sensor, and the touch sensing unit TSU, which will be described in more detail below, may be omitted.

The touch sensing unit TSU senses an input of a user applied from the outside. A user's input includes various suitable kinds of external inputs, for example, such as a touch from a portion of user's body, light, heat, pressure, and/or the like. FIG. 2 illustrates a view in which the touch sensing unit TSU is omitted (or not shown).

In the embodiment shown in FIGS. 1 to 3, the display panel 100 may include a display region DA, and a peripheral region NDA. The display region DA may be a region at (e.g., in or on) which an image IM is generated as described above. A plurality of pixels PX (e.g., see FIG. 2) for generating the image IM may be disposed at (e.g., in or on) the display region DA. A detailed description thereof will be described in more detail below.

The peripheral region NDA is adjacent to the display region DA. The peripheral region NDA may surround (e.g., around a periphery of) the display region DA. In some embodiments, the peripheral region NDA may overlap with the bezel region BZA in the thickness direction (e.g., the third direction DR3). A drive circuit, a drive line, and/or the like for driving the display region DA may be disposed at (e.g., in or on) the peripheral region NDA.

In some embodiments, a portion of the peripheral region NDA of the display panel 100 may be bent. In this case, a portion (e.g., of the bent portion) of the peripheral region NDA faces the front surface of the electronic device ED, and another portion (e.g., of the bent portion) of the peripheral region NDA may face the rear surface of the electronic device ED. However, the present disclosure is not limited thereto, and the peripheral region NDA may be omitted in the display panel 100 according to an embodiment of the present disclosure.

The display panel 100 according to an embodiment of the present disclosure may include a module part (e.g., a module area or a component area) PA provided in the display region DA. The module part PA defines a space in which the electronic module 300 is disposed. The module part PA may include a module hole MH and a blocking recess BR.

The module hole MH passes through (e.g., extends through) the display panel 100. The module hole MH may have a cylindrical shape having a height in the third direction DR3. The module hole MH may accommodate the electronic module 300. According to one or more embodiments of the present disclosure, a thin display device may be implemented by including the module hole MH.

The blocking recess BR is disposed adjacent to the module hole MH. The blocking recess BR may be formed by being recessed from the front surface of the display panel 100. The blocking recess BR may have a closed-curve shape that surrounds (e.g., around a periphery of) the module hole MH. In the present embodiment, the blocking recess BR may have a circularly annular shape that surrounds (e.g., around a periphery of) the module hole MH. The blocking recess BR may include a first recess BR1 and a second recess BR2. The module hole MH and the blocking recess BR will be described in more detail below.

The window 200 provides the front surface of the electronic device ED. The window 200 may be disposed on the front surface of the display panel 100, and may protect the display panel 100. For example, the window 200 may include a glass substrate, a sapphire substrate, or a plastic film. The window 200 may have a multilayered structure or a single layer structure. For example, the window 200 may have a laminate structure including a plurality of plastic films bonded to each other by an adhesive, or a laminate structure including a glass substrate and a plastic film that are bonded to each other by an adhesive.

The window 200 may be comprising a transmissive region TA and the bezel region BZA. The transmissive region TA may be a region corresponding to the display region DA. For example, the transmissive region TA overlaps with the front surface of the display region DA. The image IM displayed at (e.g., in or on) the display region DA of the display panel 100 may be viewed from the outside through the transmissive region TA.

The bezel region BZA may define the shape of the transmissive region TA. The bezel region BZA may be adjacent to the transmissive region TA, and may surround (e.g., around a periphery of) the transmissive region TA. The bezel region BZA may have a suitable or desired color (e.g., a predetermined color). The bezel region BZA may cover the peripheral region NDA of the display panel 100, and may prevent or substantially prevent the peripheral region NDA from being viewed from the outside. However, the present disclosure is not limited thereto, and in the window 200 according to an embodiment of the present disclosure, the bezel region BZA may be omitted.

The power supply module PM supplies power used for overall operations of the electronic device ED. For example, the power supply module PM may include a normal battery module (e.g., a battery).

The housing 400 may be connected to the window 200. The housing 400 provides the rear surface of the electronic device ED. The housing 400 may be connected with the window 200, and may define an inner space to accommodate the display panel 100, the electronic module 300, and various constituents illustrated in FIG. 3 therein. The housing 400 may include a material having a relatively high stiffness. For example, the housing 400 may include a plurality of frames and/or plates composed of glass, plastic, or metal. The housing 400 may protect (e.g., may stably protect) the constituents of the electronic device ED accommodated in the inner space from external shocks.

The electronic module 300 includes various suitable functional modules for operating the electronic device ED. For example, the electronic module 300 may include the first electronic module EM1 and the second electronic module EM2.

The first electronic module EM1 may be directly mounted on a mother board that is electrically connected to the display module DD, or may be mounted on a separate board and electrically connected to the mother board through a connector and/or the like.

The first electronic module EM1 may include a control module (e.g., a controller) CM, a wireless communication module (e.g., a wireless communication device or circuit) 26, an image input module (e.g., an image input device or circuit) 35, an audio input module (e.g., an audio input device or circuit) 40, a memory 50, and an external interface 60. Some of the modules may not be mounted on the mother board, but may also be electrically connected to the mother board through a flexible circuit board.

The control module CM controls the overall operations of the electronic device ED. In some embodiments, the control module CM may be a microprocessor. For example, the control module CM may activate or deactivate the display module DD. The control module CM may control other modules, for example, such as the image input module 35 and/or the audio input module 40 on the basis of a touch signal received from the display module DD.

The wireless communication module 26 may transmit and/or receive a wireless signal with another terminal using a Bluetooth or WiFi line. The wireless communication module 26 may transmit/receive an audio signal using a general communication line. The wireless communication module 26 may include a transmission unit (e.g., a transmitter) 24, which modulates and receives a signal to be transmitted, and a receiving part (e.g., a receiver) 25, which demodulates the received signal.

The image input module 35 processes an image signal, and converts the image signal into image data, which may be displayed by the display module DD. The audio input module 40 receives an external audio signal through a microphone and/or the like in a recording mode, a voice recognition mode, and/or the like, and converts the audio signal into electrical voice data.

The external interface 60 may function as an interface connected to an external charger, a wired/wireless data port, a card socket (e.g., a memory card or a SIM/UIM card), and/or the like.

The second electronic module EM2 may include an audio output module (e.g., an audio output device or circuit) 70, a light-emitting module (e.g., a light-emitting device or circuit) 80, a light-receiving module (e.g., a light-receiving device or circuit) 90, a camera module (e.g., a camera device or circuit) 101, and/or the like. The components may be directly mounted on the mother board or may be mounted on a separate board, and may be electrically connected to the display module DD through a connector and/or the like, and/or may be electrically connected to the first electronic module EM1.

The audio output module 70 converts audio data received from the wireless communication module 26 and/or audio data stored in the memory 50, and outputs the audio data to the outside.

The light-emitting module 80 generates and outputs light. The light-emitting module 80 may output an infrared ray. The light-emitting module 80 may include an LED element. The light-receiving module 90 may detect an infrared ray. The light-receiving module 90 may be activated when an infrared ray of at least a suitable level (e.g., a predetermined level) is detected. The light-receiving module 90 may include a CMOS sensor. After the infrared light generated from the light-emitting module 80 is output, the infrared ray may be reflected from an external object (e.g., the user's finger or face), and the reflected infrared ray may be incident on the light-receiving module 90. The camera module 101 captures an external image.

The electronic module 300 illustrated in FIG. 2 may be any one from among the constituents of the second electronic module EM2. In this case, other constituents of the first electronic module EM1 and the second electronic module EM2 may be disposed at (e.g., in or on) other positions. However, the present disclosure is not limited thereto, and the electronic module 300 may be any one or more from among the modules constituting the first electronic module EM1 and/or the second electronic module EM2, and the electronic module 300 is not limited to any one embodiment.

Figure 4:
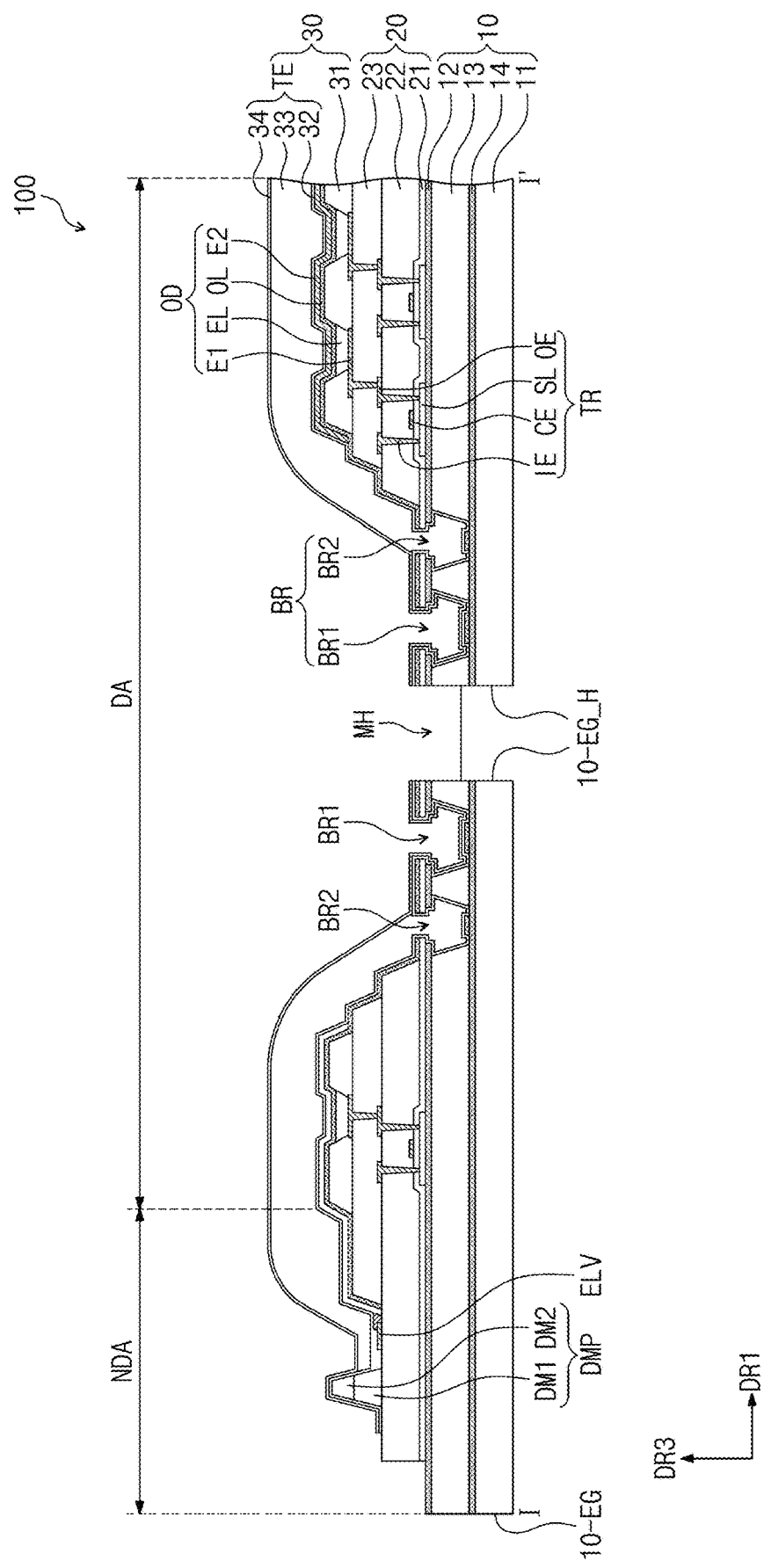
FIG. 4 is a cross-sectional view taken along the line I-I' of FIG. 2.
Figure 5:
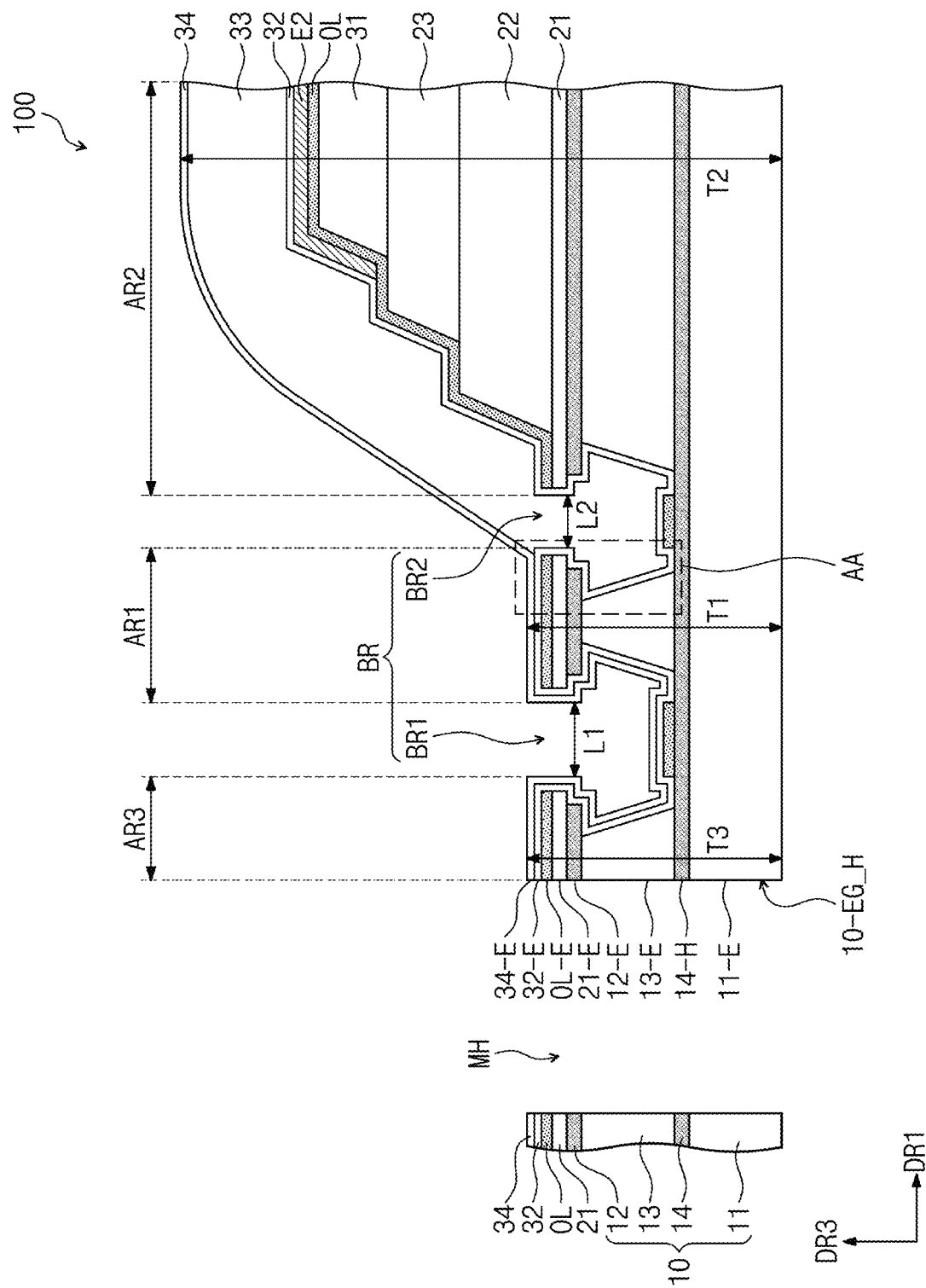
FIG. 5 is a partial expanded cross-sectional view of FIG. 4.
Figure 6:
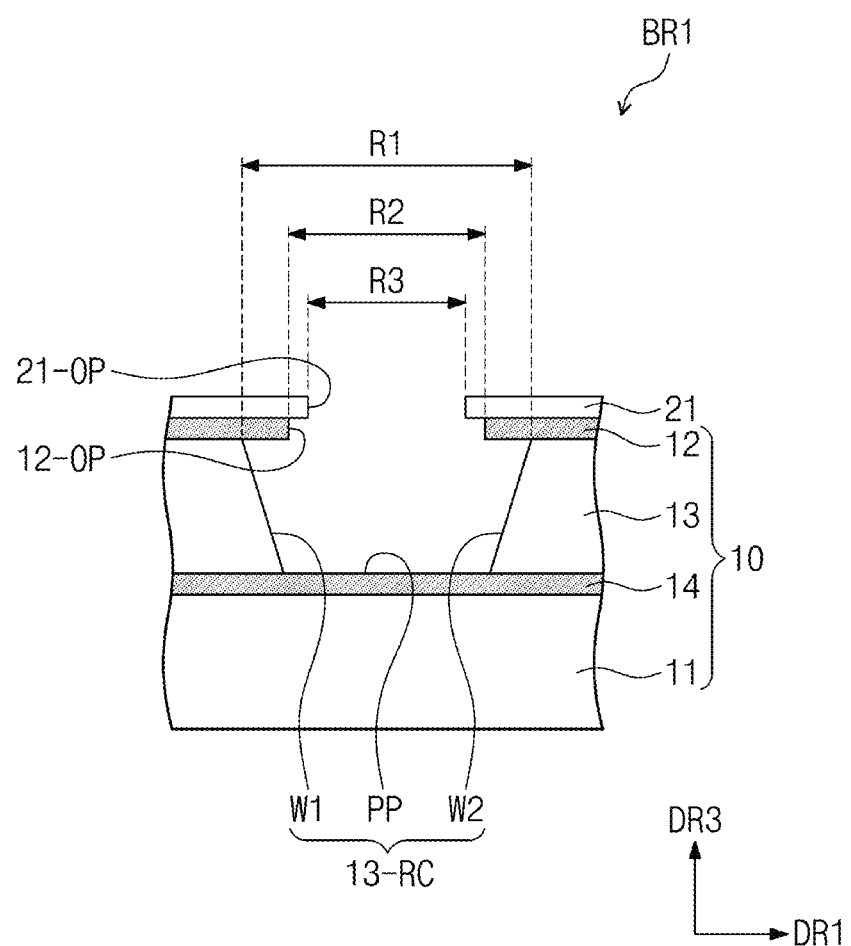
FIG. 6 is a partial expanded cross-sectional view of FIG. 5.

FIG. 4 is a cross-sectional view taken along the line I-I' of FIG. 2. FIG. 5 is a partial expanded cross-sectional view of FIG. 4. FIG. 6 is a partial expanded cross-sectional view of FIG. 5. Hereinafter, with reference to FIGS. 4 to 6, a display panel 100 according to an embodiment of the present disclosure will be described in more detail.

As illustrated in FIG. 4, the display panel 100 includes a base substrate 10, a thin film element layer 20, and a display element layer 30. The base substrate 10, the thin film element layer 20, and the display element layer 30 may be stacked (e.g., may be laminated) in the third direction DR3.

The base substrate 10 may include a first base layer 11, a first barrier layer 12, a second base layer 13, and a second barrier layer 14.

The first base layer 11 constitutes a lower layer of the base substrate 10. The rear surface of the first base layer 11 may define the rear surface of the based substrate 10.

The first base layer 11 may be an insulating layer including an organic material. The first base layer 11 may include flexible plastic. For example, the first base layer 11 may include polyimide (PI), polyethylene naphthalate (PEN), polyethylene terephthalate (PET), polyarylate, polycarbonate (PC), polyetherimide: (PEI), or polyethersulfone (PES).

The first barrier layer 12 may include an inorganic material. The first barrier layer 12 constitutes an upper layer of the base substrate 10. The front surface of the first barrier layer 12 may define the front surface of the base substrate 10.

The first barrier layer 12 may be an insulating layer containing an inorganic material. For example, the first barrier layer 12 may include silicon oxide, silicon nitride, amorphous silicon, or the like.

The second base layer 13 and the second barrier layer 14 may be disposed between the first base layer 11 and the first barrier layer 12. The second base layer 13 may include the same or substantially the same material as that of the first base layer 11. The second barrier layer 14 may include the same or substantially the same material as that of the first barrier layer 12.

The first base layer 11, the second base layer 13, the first barrier layer 12, and the second barrier layer 14 may be alternately disposed. The first barrier layer 12 and the second barrier layer 14 may be disposed on the second base layer 13 and the first base layer 11, respectively. The first barrier layer 12 and the second barrier layer 14 may block or substantially block external moisture and/or oxygen permeating through the first base layer 11 and the second base layer 13.

The thin film element layer 20 is disposed on the base substrate 10. The thin film element layer 20 includes a plurality of insulating layers, and a thin film transistor TR. The insulating layers may each include an inorganic material and/or an organic material. The insulating layers may include first to third insulating layers 21, 22, and 23.

The thin film transistor TR includes a semiconductor pattern SL, a control electrode CE, an input electrode IE, and an output electrode OE. The thin film transistor TR controls a charge movement in the semiconductor pattern SL through the control electrode CE, and outputs an electrical signal input from the input electrode IE through the output electrode OE.

The first insulating layer 21 may be disposed between the semiconductor pattern SL and the control electrode CE. In the present embodiment, the control electrode CE is illustrated to be disposed on the semiconductor pattern SL. However, the present disclosure is not limited thereto, and the thin film transistor TR according to an embodiment of the present disclosure may include the semiconductor pattern SL disposed on the control electrode CE, but is not limited to any one embodiment.

The second insulating layer 22 may be disposed between the control electrode CE, and the input electrode IE and the output electrode OE. The input electrode IE and the output electrode OE are disposed on the second insulating layer 22. The input electrode IE and the output electrode OE pass through (e.g., extend or penetrate through) the first insulating layer 21 and the second insulating layer 22, and are each connected to the semiconductor pattern SL. However, the present disclosure is not limited thereto, and the input electrode IE and the output electrode OE may be directly connected to the semiconductor pattern SL.

The third insulating layer 23 is disposed on the second insulating layer 22. The third insulating layer 23 may cover the thin film transistor TR. The third insulating layer 23 electrically insulates the thin film transistor TR and the display element layer 30 from each other.

The display element layer 30 includes an organic light-emitting element OD, and a plurality of insulating layers. The insulating layers may include a fourth insulating layer 31, and a sealing layer TE.

The fourth insulating layer 31 is disposed on the third insulating layer 23. A plurality of openings may be defined in the fourth insulating layer 31.

The organic light-emitting element OD may be provided in each of the openings. The organic light-emitting element OD includes a first electrode E1, a second electrode E2, a light-emitting layer EL, and a charge control layer OL. The first electrode E1 is disposed on the thin film element layer 20. The first electrode E1 may pass through (e.g., may extend or penetrate through) the third insulating layer 23, and may be electrically connected to the transistor TR. The first electrode E1 may be provided in a plurality. At least a portion of the plurality of first electrodes E1 may be exposed by each of the openings in the fourth insulating layer 31.

The second electrode E2 is disposed on the first electrode E1. The second electrode E2 may overlap with the plurality of first electrodes E1 and the fourth insulating layer 31, and may have an integrated shape. When the organic light-emitting element OD is provided in a plurality, the same or substantially the same voltage may be applied to the second electrodes E2 of the plurality of light-emitting elements OD. Accordingly, a separate patterning process for forming the second electrode E2 may be omitted. However, the present disclosure is not limited thereto, and the second electrode E2 may be provided in a plurality so as to correspond to each of the openings in the fourth insulating layer 31.

The light-emitting layer EL may be disposed between the first electrode E1 and the second electrode E2. The light-emitting layer EL may be provided in a plurality, and disposed in each of the openings. The organic light-emitting element OD may generate light by activating the light-emitting layer EL according to a potential difference between the first electrode E1 and the second electrode E2.

The charge control layer OL is disposed between the first electrode E1 and the second electrode E2. The charge control layer OL is disposed adjacent to the light-emitting layer EL. In the present embodiment, the charge control layer OL is illustrated as being disposed between the light-emitting layer EL and the second electrode E2. However, the present disclosure is not limited thereto, and the charge control layer OL may be disposed between the light-emitting layer EL and the first electrode E1. In this case, the charge control layer OL may be provided as a plurality of layers stacked (e.g., laminated) in the third direction DR3 with the light-emitting layer EL between the layers of the charge control layer OL.

The charge control layer OL may have an integrated shape overlapping with the front surface of the base substrate 10 without a separate patterning process. The charge control layer OL is disposed in the openings and in regions other than the openings formed in the fourth insulating layer 31.

The sealing layer TE is disposed on the organic light-emitting element OD. The sealing layer TE may include an inorganic film and/or an organic film. In the present embodiment, the sealing layer TE may include a first inorganic film 32, an organic film 33, and a second inorganic film 34.

Each of the first inorganic film 32 and the second inorganic film 34 may include an inorganic material. For example, the first inorganic film 32 and the second inorganic film 34 may each include at least one from among any of aluminum oxide, silicon oxide, silicon nitride, silicon oxynitride, silicon carbonitrides, titanium oxide, zirconium oxide, and/or zinc oxide. The first inorganic film 32 and the second inorganic film 34 may include one or more materials that are the same as or different from each other.

The organic film 33 may be disposed between the first inorganic film 32 and the second inorganic film 34. The organic film 33 may include an organic material. For example, the organic film 33 may include at least one from among any of epoxy, polyimide (PI), polyethylene terephthalate (PET), polycarbonate (PC), polyethylene (PE), and/or polyacrylate.

The first inorganic film 32 and the second inorganic film 34 may have an integrated shape disposed on the front surface of the display panel 100. However, the present disclosure is not limited thereto, and the first inorganic film 32 and the second inorganic film 34 may be formed on the entire surface of the display panel 100, but may be partially removed at (e.g., in or on) a region adjacent to the module hole MH in one or more subsequent process steps.

Each of the first inorganic film 32 and the second inorganic film 34 may partially overlap with the organic film 33. Accordingly, the first inorganic film 32 and the second inorganic film 34 may be spaced apart from each other in the third direction DR3 with the organic film 33 therebetween at (e.g., in or on) some regions, and may be in direct contact with each other in the third direction DR3 at (e.g., in or on) other regions.

The display panel 100 may further include a dam part DMP. The dam part DMP may extend along an edge (e.g., a periphery) of the display region DA (e.g., see FIG. 2). In other words, the dam part DMP may surround (e.g., around a periphery of) the display region DA.

The dam part DMP may include a first dam DM1 and a second dam DM2. The first dam DM1 may include the same or substantially the same material as that of the third insulating layer 23. The first dam DM1 may be formed concurrently (e.g., simultaneously) with the third insulating layer 23, and may be disposed at (e.g., in or on) the same layer as that of the third insulating layer 23.

The second dam DM2 is stacked (e.g., is laminated) on the first dam DM1. The second dam DM2 may include the same or substantially the same material as that of the fourth insulating layer 31. The second dam DM2 may be formed concurrently (e.g., simultaneously) with the fourth insulating layer 31, and may be disposed at (e.g., in or on) the same layer as that of the fourth insulating layer 31. However, the present disclosure is not limited thereto, and in some embodiments, the dam part DMP may have a single layer structure, but is not limited to any one embodiment.

The dam part DMP may define a region in which a liquid phase organic material spreads in a process of forming the organic film 33. For example, the organic film 33 may be formed by applying an organic material (e.g., a liquid phase organic material) on the first inorganic film 32 with an inkjet method, and in this example, the dam part DMP may define (e.g., may set) a boundary of the region in which the liquid phase organic material is disposed to prevent or substantially prevent the liquid phase organic material from flooding out of the dam part DMP.

Hereinafter, with reference to FIGS. 5 and 6, a region in which a module hole MH and a blocking recess BR are defined is described in more detail. In FIG. 6, the first inorganic film 32 and the second inorganic film 34 are not shown for convenience of description. The module hole MH passes (e.g., penetrates or extends) through the display panel 100 in the third direction DR3. As the module hole MH is defined in the display region DA, the module hole MH passes through not only the base substrate 10, but also a portion of the layers constituting the display region DA.

In more detail, the module hole MH passes through (e.g., penetrates or extends through) the base substrate 10. An inner surface 10-EG_H of the module hole MH may be defined by ends of a plurality of layers. An end 11-E of the first base layer 11, an end 12-E of the first barrier layer 12, an end 13-E of the second base layer 13, and an end 14-E of the second barrier layer 14 may be defined in the first base layer 11, the first barrier layer 12, the second base layer 13, and the second barrier layer 14, respectively, at the module hole MH.

In addition, the module hole MH passes through (e.g., penetrates or extends through) at least a portion of the layers constituting the display region DA. For example, the module hole MH may pass through the first insulating layer 21, the charge control layer OL, the first inorganic film 32, and the second inorganic film 34. Accordingly, an end 21-E of the first insulating layer 21, an end OL-E of the charge control layer OL, an end 32-E of the first inorganic film 32, and an end 34-E of the second inorganic film 34 may be defined in the first insulating layer 21, the charge control layer OL, the first inorganic film 32, and the second inorganic film 34, respectively, at the module hole MH.

In the present embodiment, the end 11-E of the first base layer 11, the end 12-E of the first barrier layer 12, the end 13-E of the second base layer 13, the end 14-E of the second barrier layer 14, the end 21-E of the first insulating layer 21, the end OL-E of the charge control layer OL, the end 32-E of the first inorganic film 32, and the end 34-E of the second inorganic film 34 may be aligned with each other in the third direction DR3. Accordingly, the module hole MH may have a cylindrical shape having a height in the third direction DR3. However, the present disclosure is not limited thereto, and in some embodiments, at least some of the ends of the layers defining the module hole MH may not be aligned with each other (e.g., may extend further towards a center of the module hole MH than one or more of the others), but is not limited to any one embodiment.

The blocking recess BR may include the first recess BR1 and the second recess BR2. When viewed in a plan view, the first recess BR1 surrounds (e.g., around a periphery of) the module hole MH, and the second recess BR2 surrounds (e.g., around a periphery of) the first recess BR1. The module hole MH, the first recess BR1, and the second recess BR2 may be spaced apart from each other (e.g., in the first direction DR1). In another embodiment of the present disclosure, the blocking recess BR may further include a blocking recess that is spaced apart from the second recess BR2, and surrounds (e.g., around a periphery of) the second recess BR2.

The first recess BR1 and the second recess BR2 may have mutually different widths from each other in a direction perpendicular to or substantially perpendicular to the third direction DR3. The direction perpendicular to or substantially perpendicular to the third direction DR3 may be a direction parallel to or substantially parallel to the front surface and/or the rear surface of the base substrate 10 that is not bent, for example, such as the first direction DR1 and/or the second direction DR2.

The widths of the first recess BR1 and the second recess BR2 may be measured at the same position, and when viewed in the third direction DR3, the widths of the first recess BR1 and the second recess BR2 may be measured so as to pass through the centers of the first recess BR1 and the second recess BR2, respectively.

In an embodiment of the present disclosure, the first recess BR1 may have a first width L1 in the direction (e.g., the first direction DR1) perpendicular to or substantially perpendicular to the third direction DR3, and the second recess BR2 may have a second width L2 in the direction (e.g., the first direction DR1) perpendicular to or substantially perpendicular to the third direction DR3. The first width L1 may be greater than the second width L2.

The first recess BR1 and the second recess BR2 may have the same or substantially the same (or similar) cross-sectional shapes as each other, except for having mutually different widths from each other, and thus, the shape of the first recess BR1 will be described in more detail hereinafter. In other words, the shape of the second recess BR2 may be the same or substantially the same as the shape of the first recess BR1, and thus, redundant description thereof may not be repeated.

The first recess BR1 may be recessed in the third direction DR3 from the front surface of the base substrate 10. Accordingly, the first recess BR1 passes through the front surface of the base substrate 10, but does not pass through the rear surface thereof.

The first recess BR1 may be formed by removing at least a portion of the base substrate 10. For example, the first recess BR1 may be formed by removing at least a portion of the first barrier layer 12 and at least a portion of the second base layer 13. In an embodiment of the present disclosure, the first recess BR1 is illustrated to pass through (e.g., to penetrate or extend through) the first barrier layer 12 and the second base layer 13 in the third direction DR3, but the present disclosure is not limited thereto, and the second base layer 13 may be partially removed such that the first recess BR1 does not fully penetrate the second base layer 13. The first base layer 11 and the second barrier layer 14 may not be removed when forming the first recess BR1. Accordingly, oxygen and/or moisture introduced in a lower portion of the first base layer 11 may not infiltrate into the first recess BR1.

The first recess BR1 according to an embodiment of the present disclosure includes an inner surface that is defined in the base substrate 10, and has an undercut shape. The first recess BR1 may include a recessed part 13-RC, and at least one through part. For example, as shown in the embodiment of FIG. 6, the first recess BR1 may include a through part 12-OP of the first barrier layer 12, and a through part 21-OP of the first insulating layer 21.

The recessed part 13-RC is defined in the second base layer 13. The recessed part 13-RC may be recessed from the front surface of the second base layer 13. The recessed part 13-RC includes a plane surface PP, a first side surface W1, and a second side surface W2. While the first side surface W1 and the second side surface W2 are separately illustrated in FIG. 6 for convenience of illustration, the first side surface W1 and the second side surface W2 may be connected to each other, for example, to form an integrated surface.

The plane surface PP may be a surface that is recessed from the front surface toward the rear surface of the second base layer 13. In some embodiments, the plane surface PP may be spaced apart in the third direction DR3 from the rear surface of the second base layer 13. In an embodiment of the present disclosure, the plane surface PP may be a portion of the upper surface of the second barrier layer 14 that is exposed when the first recess BR1 is formed. The first side surface W1 and the second side surface W2 are each connected to the plane surface PP. The first side surface W1 and the second side surface W2 may each be inclined from the plane surface PP. In the recessed part 13-RC, an angle formed by each of the first side surface W1 and the second side surface W2 with respect to the plane surface PP may be at least approximately 90 degrees.

The through part 12-OP of the first barrier layer 12 and the recessed part 13-RC may form an undercut shape. In more detail, the first barrier layer 12 may overlap with the recessed part 13-RC of the second base layer 13. The first barrier layer 12 protrudes inward from the recessed part 13-RC, and covers at least a portion of the recessed part 13-RC. A width R2 of the through part 12-OP of the first barrier layer 12 in the first direction DR1 may be smaller than a width R1 of the recess part 13-RC in the first direction DR1.

The width R1 of the recessed part 13-RC, which is measured in the first direction DR1 at a position parallel to the upper surface of the second base layer 13, may be greater than a width of the recessed part 13-RC that is measured in the first direction DR1 at a position parallel to the lower surface of the second base layer 13. The recessed part 13-RC may have a truncated conic shape. However, the present disclosure is not limited thereto, and in other embodiments, the recessed part 13-RC may have a truncated pyramid shape or a truncated elliptic cone shape.

The first inorganic film 32 may extend to a region in which the first and second recesses BR1 and BR2 are disposed. The first inorganic film 32 may be disposed along a region adjacent to the first and second recesses BR1 and BR2, and on the inner surfaces of the first and second recesses BR1 and BR2. Accordingly, the insides (e.g., the inner surfaces) of the first and second recesses BR1 and BR2 may be covered by the first inorganic film 32.

The organic film 33 of the sealing layer TE may be filled in the second recess BR2, but may not be filled in the first recess BR1. Whether the organic film 33 of the sealing layer TE is filled in the first and second recesses BR1 and BR2 may be determined on the basis of whether the recessed part 13-RC is completely filled. For example, when the organic film 33 of the sealing layer TE completely fills the recessed part 13-RC of the first recess BR1 or exceeds the recessed part 13-RC of the first recess BR1 and partially fills the through part 12-OP of the first barrier layer 12, the organic film 33 of the sealing layer TE may be defined to be filled in the first recess BR1. In addition, when the organic film 33 of the sealing layer TE may not completely fill the recessed part 13-RC of the first recess BR1, the organic film 33 of the sealing layer TE may be defined as not being filled in the first recess BR1.

The second inorganic film 34 may extend to a region in which the first and second recesses BR1 and BR2 are disposed. The second inorganic film 34 may be disposed along a region adjacent to the first and second recesses BR1 and BR2, and on the inner surfaces of the first recess BR1. Accordingly, the inside (e.g., the inner surfaces) of the first recess BR1 may be covered by the second inorganic film 34. Further, because the organic film 33 of the sealing layer TE is filled on the inner surfaces of the second recess BR2, the second inorganic film 34 may not be disposed on the inner surfaces of the second recess BR2. The organic film 33 may be disposed between the first inorganic film 32 and the second inorganic film 34 at (e.g., in or on) a region overlapping with the second recess BR2.

According to an embodiment of the present disclosure, the charge control layer OL may have a disconnected end at (e.g., in or on) a region adjacent to the first and second recesses BR1 and BR2, and may not overlap with the blocking recess BR. The disconnected end adjacent to the blocking recess BR of the charge control layer OL may be covered by the first inorganic film 32 and the second inorganic film 34.

As illustrated in FIGS. 4 and 5, at (e.g., in or on) a region adjacent to the module hole MH, the base substrate 10, the thin film element layer 20, and the display element layer 30 may each have disconnected ends. The disconnected ends are exposed through the module hole MH. Moisture and/or oxygen outside the display panel 100 may be introduced to the base substrate 10, the thin film element layer 20, and/or the display element layer 30 through the exposed ends.

According to an embodiment of the present disclosure, the infiltration path of the oxygen and/or moisture introduced from the module hole MH may be blocked or substantially blocked by defining the first and second recesses BR1 and BR2 that are adjacent to the module hole MH. In more detail, the first recess BR1 functions to firstly block the oxygen and/or moisture introduced through the module hole MH, and the second recess BR2 serves as a second blocking function. For example, the first recess BR1 separates a portion of the charge control layer OL disposed between the module hole MH and the first recess BR1 from a portion disposed outside the first recess BR1. Accordingly, even when external oxygen and/or moisture is introduced through the module hole MH, the external oxygen and/or moisture are not transferred to the outside of the first recess BR1, and thus, damage to the thin film element layer 20 or the display element layer 30, which are present outside the blocking recess BR1, may be prevented or substantially prevented (e.g., may be stably prevented). The second recess BR2 has the same or substantially the same structure as that of the first recess BR1, and thus, may perform a similar function.

According to an embodiment of the present disclosure, the first inorganic film 32 covers a region between the module hole MH and the first recess BR1, a region between the first and second recesses BR1 and BR2, inner regions of the first and second recesses BR1 and BR2, and an outer region of the second recess BR2. In addition, the second inorganic film 34 covers a region between the module hole MH and the first recess BR1, a region between the first and second recesses BR1 and BR2, an inner region of the first recess BR1, and an outer region of the second recess BR2. Disconnected organic layers adjacent to the first and second recesses BR1 and BR2, for example, the charge control layer OL, are covered by the first inorganic film 32 and the second inorganic film 34. Accordingly, the blocking degree of introduced moisture and/or oxygen may be improved.

Figure 7:
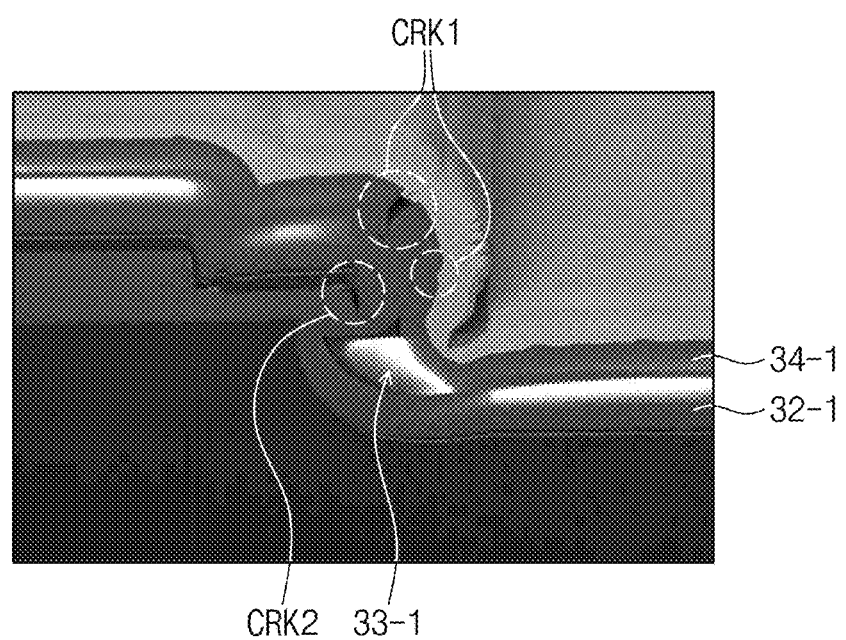
FIG. 7 is a photograph obtained by imaging a partial region of a display device according to a comparative example with FIG. 5 of the present disclosure.

FIG. 7 is a photograph obtained by imaging a partial region of a display device according to a comparative example with FIG. 5 of the present disclosure. Unlike the embodiment of FIG. 5 of the present disclosure, the display device according to the comparative example of FIG. 7 may have a structure in which the organic film 33 of the sealing layer TE is not filled in at least one of the blocking recesses (e.g., in the second recess BR2). The region displayed in FIG. 7 is a region of the comparative example corresponding to the region AA of FIG. 5.

In the comparative example illustrated in FIG. 7, the constituents corresponding to the first inorganic film 32, the organic film 33, and the second inorganic film 34 will be described as a first inorganic film 32-1, an organic film 33-1, and a second inorganic film 34-1, respectively.

In FIG. 7, the organic film 33-1 partially contacts the inner surface of a blocking recess, and does not fill the blocking recess. The second inorganic film 34-1 includes a portion that is sharply bent (e.g., that is rapidly bent) by an undercut shape of the blocking recess, and a crack CRK1 may be caused in the bent portion by an external shock. Similarly, the first inorganic film 32-1 includes a portion that is sharply bent (e.g., that is rapidly bent) by the undercut shape of the blocking recess, and a crack CRK2 may be caused in the bent portion. Moisture may infiltrate through the cracks CRK1 and CRK2, and may damage an organic light-emitting element OD.

Referring again to FIGS. 4 to 6, in an electronic device including the display panel 100 according to an embodiment of the present disclosure, the organic film 33 of the sealing layer TE is filled in the second recess BR2, and the second inorganic film 34 is supported by the organic film 33 in a region overlapping with the second recess BR2, and thus, does not have a sharply bent (e.g., a rapidly bent) portion. Accordingly, in the region overlapping with the second recess BR2, occurrence of a crack may be prevented or substantially prevented in the second inorganic film 34. In addition, the organic film 33 filled in the second recess BR2 may make contact with the first inorganic film 32, and may partially absorb a shock applied to the first inorganic film 32, and thus, may prevent or substantially prevent the occurrence of a crack in the first inorganic film 32.

If the organic film 33 is also filled in the first recess BR1 in addition to the second recess BR2, the organic film 33 may extend up to a portion between the end 32-E of the first inorganic film 32 and the end 34-E of the second inorganic film 34. In this case, the organic film 33 may serve as a path through which external oxygen and/or moisture may be introduced through the module hole MH.

Accordingly, in the electronic device ED including the display panel 100 according to an embodiment of the present disclosure, while preventing or substantially preventing the occurrence of a crack, which may be caused in the first and second inorganic films 32 and 34, by filling the organic film 33 in the second recess BR2, the introduction path of oxygen and/or moisture through the module hole MH may be blocked or substantially blocked by not filling the organic film 33 in the first recess BR1.

According to an embodiment of the present disclosure, the first recess BR1 may have a greater width than that of the second recess in a direction perpendicular to or substantially perpendicular to the third direction DR3.

The organic film 33 of the sealing layer TE may be formed by using an inkjet apparatus, but it may be difficult to accurately control the discharge amount of the inkjet apparatus. In addition, organic materials discharged from the inkjet apparatus may spread (e.g., may easily spread), and thus, may not be easily controlled to spread up to an accurate position.

The second recess BR2 has a relatively smaller width, and the organic film 33 may be disposed (e.g., may be easily disposed) in the second recess BR2. Therefore, the first inorganic film 32 and the second inorganic film 34 are stably protected by the organic film 33, and the occurrence of a crack may be prevented or substantially prevented. In addition, because the second recess BR2 is not a region at (e.g., in or on) which an image is directly displayed, an increase in the non-display region may be minimized or reduced by the second recess BR2.

The first recess BR1 has a relatively greater width, and the organic film 33 may not be disposed (e.g., may not be easily disposed) in the first recess BR1. In a forming process of the organic film 33, even when slightly exceeding the second recess BR2, the first recess BR1 having a larger volume may not be filled. Accordingly, it may be possible to more reliably prevent or substantially prevent a situation in which the organic film 33 extends up to a portion between the end 32-E of the first inorganic film and the end 34-E of the second inorganic film, and thus, it may be possible to stably block the path through which oxygen and/or moisture is introduced from the module hole MH.

Figure 8:
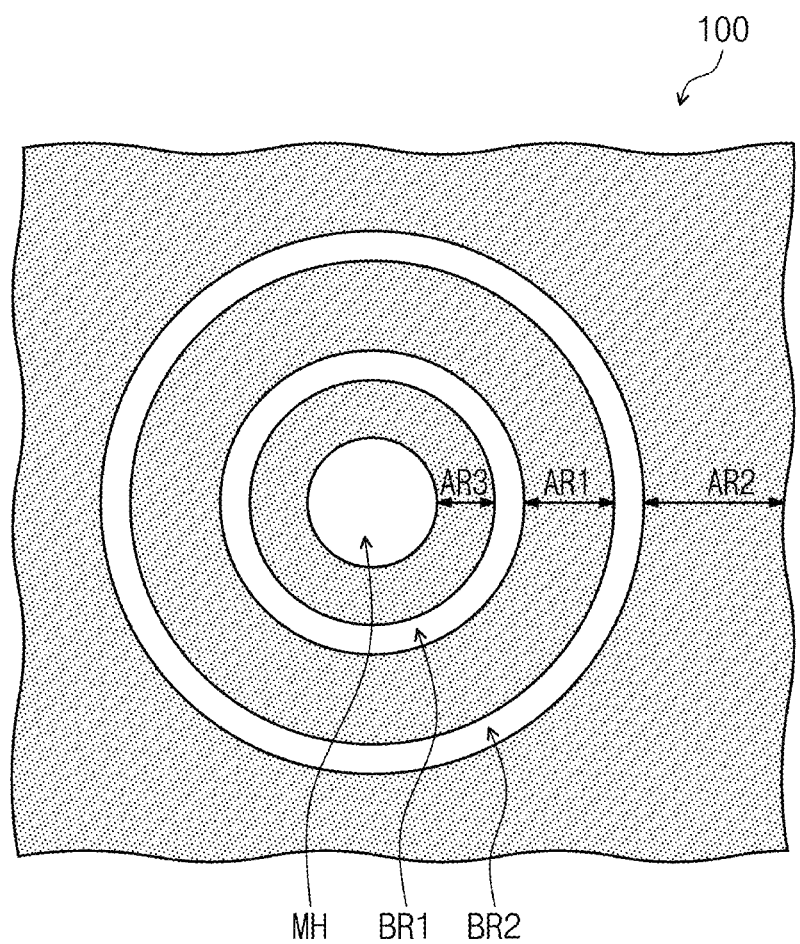
FIG. 8 is a plan view illustrating a module hole, a first recess, a second recess, and surroundings thereof of a display panel according to an embodiment of the present disclosure.

FIG. 8 is a plan view illustrating a module hole MH, a first recess BR1, a second recess BR2, and the surroundings thereof in a display panel according to an embodiment of the present disclosure.

Referring to FIGS. 5 to 6 and FIG. 8, in the display panel 100, a region between the first recess BR1 and the second recess BR2 may be defined as a first region AR1, a region outside the second recess BR2 may be defined as a second region AR2, and a region between the module hole MH and the first recess BR1 may be defined as a third region AR3. The first region AR1, the second region AR2, and the third region AR3 may be regions inside the display region DA.

In an embodiment of the present disclosure, at least one from among any of the first to fourth insulating layers 21, 22, 23, and 31, or the organic film 33 of the sealing layer TE may not be disposed at (e.g., in or on) the first region AR1. FIGS. 4 and 5 illustrate an example in which all of the first to fourth insulating layers 21, 22, 23, and 31, and the organic film 33 of the sealing layer TE are not disposed at (e.g., in or on) the first region AR1.

The first to fourth insulating layers 21, 22, 23 and 31, and the organic film 33 of the sealing layer TE may be disposed at (e.g., in or on) the second region AR2.

Accordingly, a first distance T1 between the upper surface of the second inorganic film 34 and the lower surface of the first base layer 11 in the first region AR1 may be smaller than a second distance T2 between the upper surface of the second inorganic film 34 and the lower surface of the first base layer 11 in the second region AR2. In other words, in an embodiment of the present disclosure, the thickness of the display panel 100 in the first region AR1 is smaller than the thickness of the display panel 100 in the second region AR2 of the display panel 100 in which the sealing layer TE is formed.

In addition, at least one from among any of the first to fourth insulating layers 21, 22, 23 and 31, or the organic film 33 of the sealing layer TE may not be disposed at (e.g., in or on) the third region AR3. Accordingly, a third distance T3 between the upper surface of the second inorganic film 34 and the lower surface of the first base layer 11 in the third region AR3 may be smaller than the second distance T2 between the upper surface of the second inorganic film 34 and the lower surface of the first base layer 11 in the second region AR2. The layer structure of the display panel 100 in the third region AR3 may be the same or substantially the same as the layer structure of the display panel 100 in the first region AR1. FIGS. 4 and 5 illustrate an example in which all of the first to fourth insulating layers 21, 22, 23 and 31, and the organic film 33 of the sealing layer TE are not disposed at (e.g., in or on) the third region AR3.

Figure 9A:
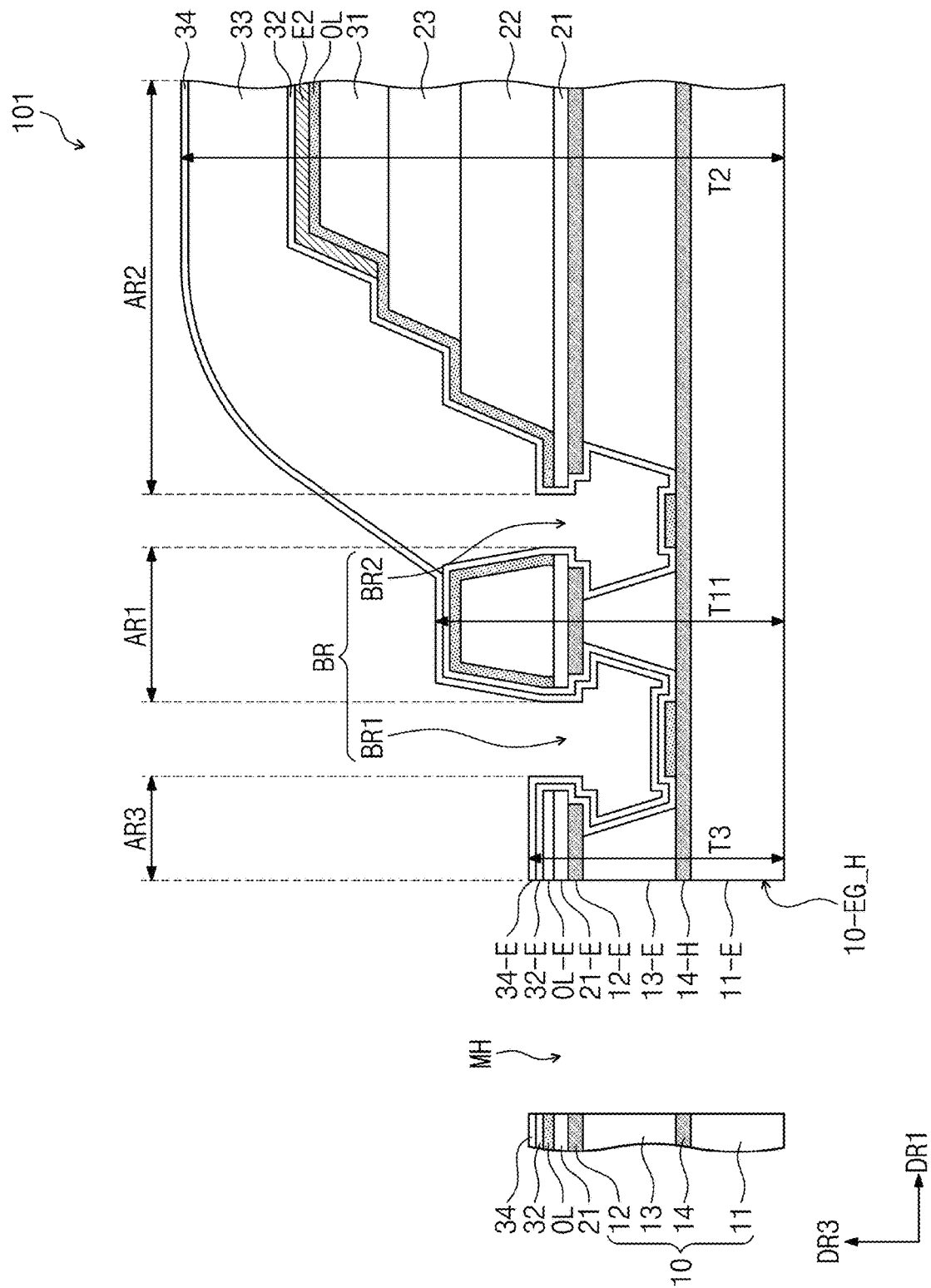
FIG. 9A is a partial cross-sectional view of an electronic device including a display panel according to another embodiment of the present disclosure.

FIG. 9A is a partial cross-sectional view of an electronic device including a display panel according another embodiment of the present disclosure. FIG. 9A illustrates a region of a display panel 101 corresponding to the region of the display panel 100 shown in FIG. 5.

The display panel 101 described with reference to FIG. 9A may be different from the display panel 100 described with reference to FIG. 5, in that the configuration of the display panel 101 corresponding to the first region AR1 in FIG. 9A may be different from that of FIG. 5. Accordingly, hereinafter, redundant description between the embodiments of FIGS. 5 and 9 may not be repeated, and the differences therebetween may be mainly described.

Referring to FIG. 9A, at least one from among any of the first to fourth insulating layers 21, 22, 23 and 31, and the organic film 33 of the sealing layer TE of the display panel 101 may be disposed at (e.g., in or on) the first region AR1. FIG. 9A illustrates an example in which a portion of the first insulating layer 21, a portion of the second insulating layer 22, and a portion of the sealing layer TE are disposed at (e.g., in or on) the first region AR1.

A first distance T11 between the upper surface of the second inorganic film 34 and the lower surface of the first base layer 11 in the first region AR1 may be greater than a third distance T3 between the upper surface of the second inorganic film 34 and the lower surface of the first base layer 11 in the third region AR3.

The first distance T11 between the upper surface of the second inorganic film 34 and the lower surface of the first base layer 11 in the first region AR1 may be smaller than a second distance T2 between the upper surface of the second inorganic film 34 and the lower surface of the first base layer 11 in the second region AR2.

In the embodiment of FIG. 9A, the second insulating layer 22 disposed in the first region AR1 may prevent or substantially prevent flooding of the inorganic film 33 from the second recess BR2 to the first recess BR1. In addition, the organic film 33 overlapping with the second recess BR2 has a greater (e.g., an increased) thickness by the second insulating layer 22 disposed in the first region AR1, so that the second inorganic film 34 overlapping with the first region AR1 and the second recess BR2 may not have a sharply bent (e.g., a rapidly bent) portion. Accordingly, an electronic device including the display panel 101 according to an embodiment of the present disclosure may more reliably prevent or substantially prevent the occurrence of a crack in the second inorganic film 34.

Figure 9B:
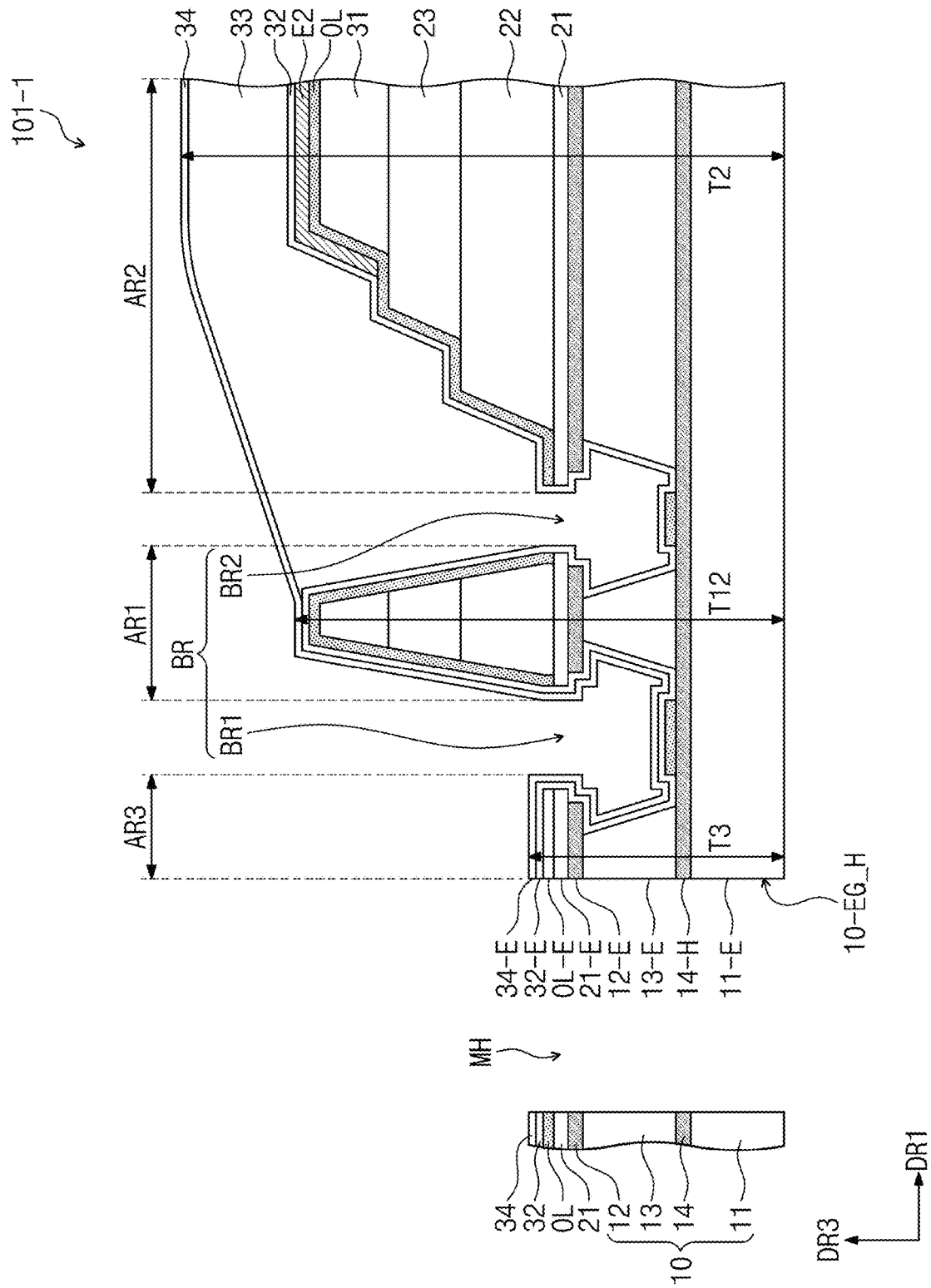
FIG. 9B is a partial cross-sectional view of an electronic device including a display panel according to another embodiment of the present disclosure.

FIG. 9B is a partial cross-sectional view of an electronic device including a display panel according to another embodiment of the present disclosure. FIG. 9B illustrates a region of a display panel 101-1 corresponding to the region of the display panel 100 shown in FIG. 5.

The display panel 101-1 described with reference to FIG. 9B may be different from the display panel 101 described with reference to FIG. 9A, in that the configuration of the display panel 101-1 corresponding to the first region AR1 in FIG. 9B may be different from that of FIG. 9A. Accordingly, hereinafter, redundant description between the embodiments of FIGS. 9A and 9B may not be repeated, and the differences therebetween may be mainly described.

FIG. 9B illustrates an example in which at least one from among any of the first to fourth insulating layers 21, 22, 23 and 31, or the organic film 33 of the sealing layer TE of the display panel 101-1 is disposed at (e.g., in or on) a first region AR1. For example, FIG. 9B illustrates that a portion of the first insulating layer 21, a portion of the second insulating layer 22, a portion of the third insulating layer 23, a portion of the fourth insulating layer 31, and a portion of the sealing layer TE are disposed at (e.g., in or on) the first region AR1.

A first distance T12 between the upper surface of the second inorganic film 34 and the lower surface of the first base layer 11 in the first region AR1 may be greater than a third distance T3 between the upper surface of the second inorganic film 34 and the lower surface of the first base layer 11 in a third region AR3.

The first distance T12 between the upper surface of the second inorganic film 34 and the lower surface of the first base layer 11 in the first region AR1 may be smaller than a second distance T2 between the upper surface of the second inorganic film 34 and the lower surface of the first base layer 11 in the second region AR2.

Figure 10:
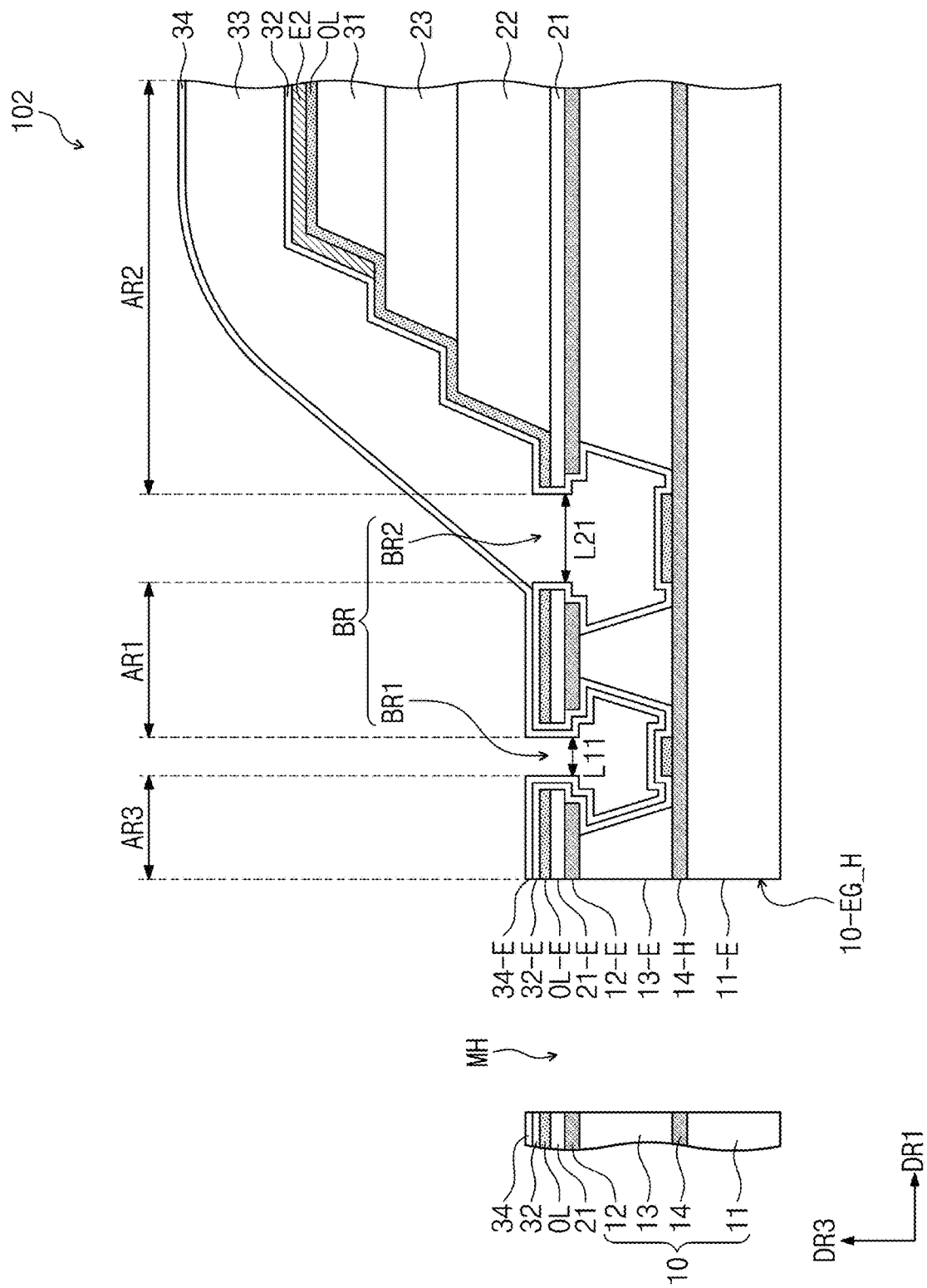
FIG. 10 is a partial cross-sectional view of an electronic device including a display panel according another embodiment of the present disclosure.

FIG. 10 is a partial cross-sectional view of an electronic device including a display panel according another embodiment of the present disclosure. FIG. 10 illustrates a region of a display panel 102 corresponding to the region of the display panel 100 shown in FIG. 5.

The display panel 102 described with reference to FIG. 10 may be different from the display panel 100 described with reference to FIGS. 4 to 6, in that the widths of the first and second recesses BR1 and BR2 in FIG. 10 may be different from those of the embodiment shown in FIG. 5. Accordingly, hereinafter, redundant description between the embodiments of FIGS. 5 and 10 may not be repeated, and the differences therebetween may be mainly described.

Referring to FIG. 10, in an embodiment of the present disclosure, the first recess BR1 may have a first width L11 in a direction perpendicular to or substantially perpendicular to the third direction DR3, the second recess BR2 may have a second width L21 in the direction perpendicular to or substantially perpendicular to the third direction DR3, and the first width L11 may be smaller than the second width L21.

The second recess BR2 may have a relatively greater width and may have a greater volume for accommodating an organic film 33, and thus, the organic film may not easily flood over the second recess BR2 after filling a recessed part 13-RC of the second recess BR2. Therefore, a first inorganic film 32 and a second inorganic film 34 may be stably protected by the organic film 33, and the occurrence of a crack may be prevented or substantially prevented.

Because the organic film 33 may not easily flood over the second recess BR2, it may not be necessary or desired to have a large width of the first recess BR1. Because the first recess BR1 has a relatively smaller width and is not a region at (e.g., in or on) which an image is actually displayed, it may be possible to minimize or reduce an increase in a non-display region by the first recess BR1.

Figure 11:
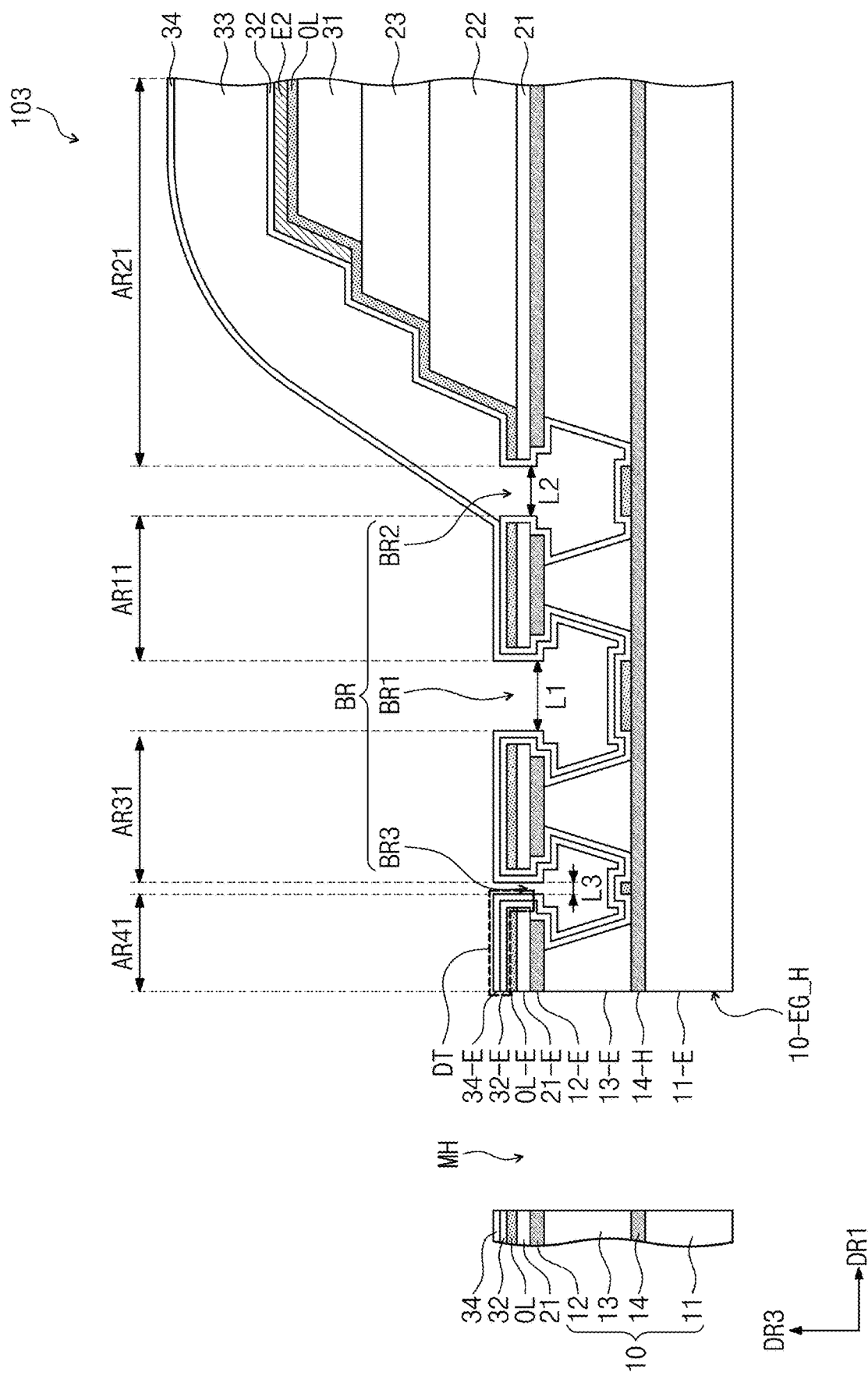
FIG. 11 is a partial cross-sectional view of an electronic device including a display panel according another embodiment of the present disclosure.

FIG. 11 is a partial cross-sectional view of an electronic device including a display panel according another embodiment of the present disclosure. FIG. 11 illustrates a region of a display panel 103 corresponding to the region of the display panel 100 shown in FIG. 5.

The display panel 103 described with reference to FIG. 11 may be different from the display panel 100 described with reference to FIGS. 4 to 6, in that the display panel 103 of FIG. 11 may further include a third blocking recess BR3. Accordingly, hereinafter, redundant description between the embodiments of FIGS. 5 and 11 may not be repeated, and the differences therebetween may be mainly described.

The display panel 103 further includes the third blocking recess BR3.

The third blocking recess BR3 may be provided closer to (e.g., more adjacent to) the module hole MH when compared to the first and second recesses BR1 and BR2. In other words, when viewed in a plan view, the third blocking recess BR3 may surround (e.g., around a periphery of) the module hole MH, and may be disposed between the module hole MH and the first recess BR1.

The organic film 33 is not filled in the third blocking recess BR3, similar to the first recess BR1.

A region between the first recess BR1 and the second recess BR2 may be defined as a first region AR11, and a region outside the second recess BR2 may be defined as a second region AR21. A region between the first recess BR1 and the third blocking recess BR3 may be defined as a third region AR31, and a region between the third blocking recess BR3 and the module hole MH may be defined as a fourth region AR41. The first region AR11, the second region AR21, the third region AR31, and the fourth region AR41 may be regions inside a display region (e.g., DA in FIG. 2).

The fourth region AR41 may have a smaller minimum width than those of the first region AR11 and the third region AR31 in a direction perpendicular to or substantially perpendicular to the third direction DR3. In the embodiment of FIG. 11, the fourth region AR41 may have a first width W1, the third region AR31 may have a second width W2, and the first region AR11 may have a third width W3. In this case, the first width W1 may be less than the second width W2 (e.g., W1<W2) and less than the third width W3 (e.g., W1<W3).

In addition, the third blocking recess BR3 may have a third width L3 in a direction perpendicular to or substantially perpendicular to the third direction DR3, and the third width L3 may be smaller than at least one from among any of the first and second widths L1 and L2, which are the widths of first and second recesses BR1 and BR2, respectively.

In the fourth region AR41, an end OL-E of the charge control layer OL is exposed to the outside through the module hole MH, and the charge control layer OL may be floated (e.g., may be easily floated) due to an absence of an adhesiveness. In the fourth region AR41, the first and second inorganic films 32 and 34 may be floated due to the floating of the charge control layer OL, and a crack may be caused or partially removed in the first and second inorganic films 32 and 34 in the fourth region AR41. For example, the first and second inorganic films 32 and 34 in the portion DT illustrated in FIG. 11 may be removed. Even when the first and second inorganic films 32 and 34 are partially removed, due to an undercut structure of the third blocking recess BR3, a crack may not be transferred up to the first recess BR1 or to the first and second inorganic films 32 and 34 in the first region AR11 that are not removed.

Accordingly, because the third blocking recess BR3 prevents or substantially prevents floating or peeling of the first and second inorganic films 32 and 34, which are in contact with the module hole MH, a non-display region may be reduced by disposing the third blocking recess BR3 to be relatively closer to the module hole MH.

Figure 12:
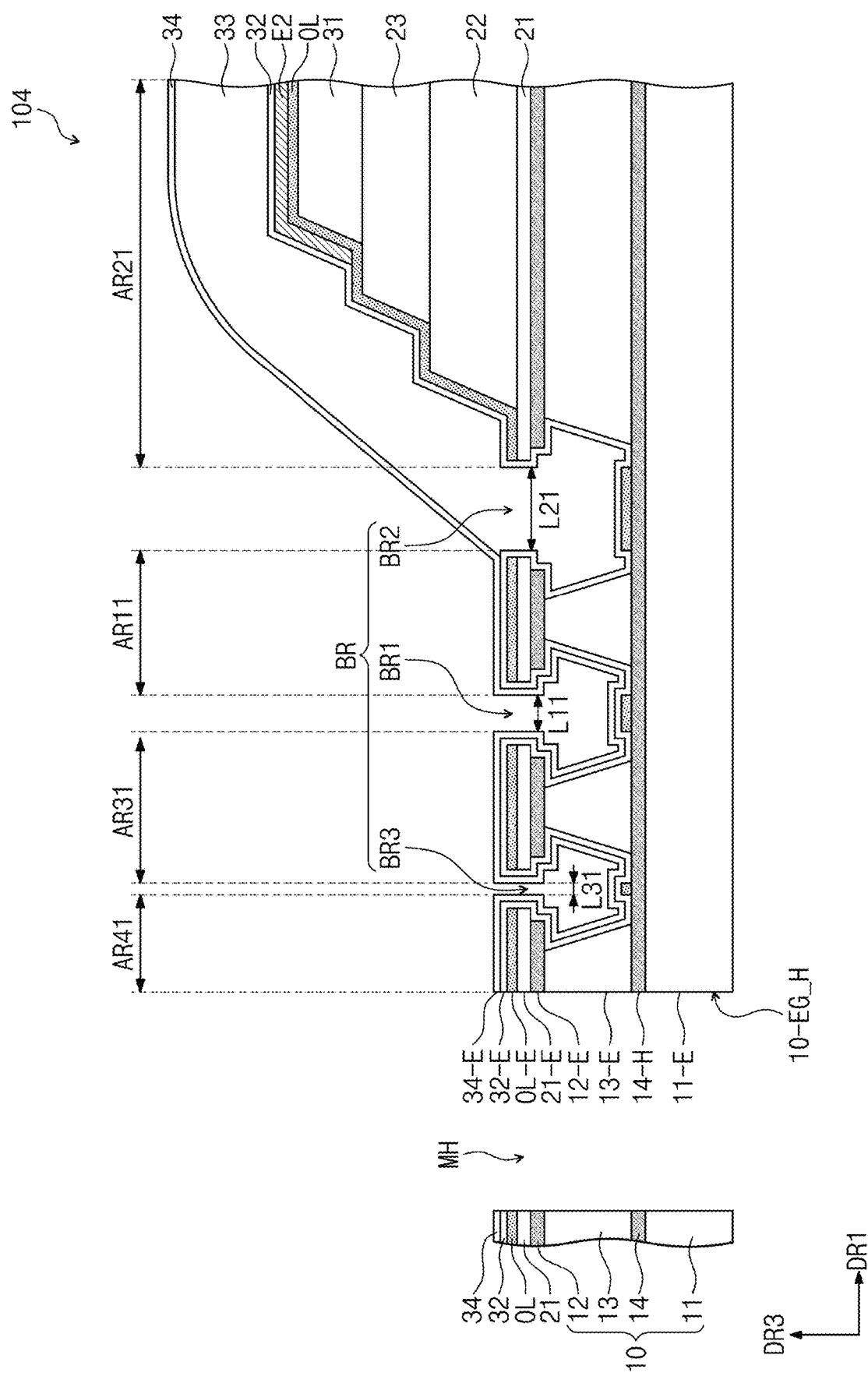
FIG. 12 is a partial cross-sectional view of an electronic device including a display panel according another embodiment of the present disclosure.

FIG. 12 is a partial cross-sectional view of an electronic device including a display panel according another embodiment of the present disclosure. FIG. 12 illustrates a region of a display panel 104 corresponding to the region of the display panel 100 shown in FIG. 5.

The display panel 104 described with reference to FIG. 12 may be different from the display panel 103 described with reference to FIG. 11, in that the widths of first and second recesses BR1 and BR2 in FIG. 12 may be different from those in FIG. 11. Accordingly, hereinafter, redundant description between the embodiments of FIGS. 11 and 12 may not be repeated, and the differences therebetween may be mainly described.

Referring to FIG. 12, in an embodiment of the present disclosure, the first recess BR1 may have a first width L11 in a direction perpendicular to or substantially perpendicular to the third direction DR3, the second recess BR2 may have a second width L21 in the direction perpendicular to or substantially perpendicular to the third direction DR3, and the first width L11 may be smaller than the second width L21.

The third blocking recess BR3 may have a third width L31 in the direction perpendicular to or substantially perpendicular to the third direction DR3, and the third width L31 may be smaller than at least one from among any of the first and second widths L11 and L21, which are the widths of the first and second recesses BR1 and BR2, respectively.

According to one or more example embodiments of the present disclosure, damage caused by moisture and/or oxygen introduced from the outside may prevented or substantially prevented. Thus, an electronic device may have improved reliability in processes and uses.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

The invention claimed is:

1. A display device comprising:
   a base substrate including a front surface and a rear surface, and comprising a display region and a peripheral region adjacent to the display region in a plan view;
   an organic light-emitting element on the display region of the base substrate; and
   a sealing layer on the organic light-emitting element, wherein the base substrate comprises:
      a module hole in the display regions, and passing through the front surface and the rear surface of the base substrate;
      a first recess at the display region and recessed from the front surface of the base substrate, the first recess surrounding the module hole in the plan view; and
      a second recess at the display region and recessed from the front surface of the base substrate, the second recess surrounding the first recess in the plan view, and
   wherein the first recess and the second recess have different widths from each other in a direction parallel to the front surface of the base substrate.

2. The display device of claim 1, wherein the first recess has a greater width than that of the second recess in the direction parallel to the front surface of the base substrate.

3. The display device of claim 1, wherein the second recess has a greater width than that of the first recess in the direction parallel to the front surface of the base substrate.

4. The display device of claim 1, wherein the sealing layer comprises an organic film that is filled in the second recess.

5. The display device of claim 4, wherein the organic film is not filled in the first recess.

6. The display device of claim 4, wherein the sealing layer further comprises:
   a first inorganic film between the organic light-emitting element and the organic film; and
   a second inorganic film on the organic film, and
   wherein the organic film is between the first inorganic film and the second inorganic film at a region overlapping with the second recess.

7. The display device of claim 1, wherein in the plan view,
   a region between the first recess and the second recess is defined as a first region,
   a region outside the second recess is defined as a second region,
   a region between the first recess and the module hole is defined as a third region, and
   a distance from the rear surface of the base substrate to an upper surface of the sealing layer in the first region is greater than a distance from the rear surface of the base substrate to the upper surface of the sealing layer in the third region.

8. The display device of claim 7, further comprising an insulating layer on the base substrate,
   wherein the insulating layer is located under the sealing layer in the first region, and is not located in the third region.

9. The display device of claim 7, wherein the distance from the rear surface of the base substrate to the upper surface of the sealing layer in the first region is smaller than a distance between the rear surface of the base substrate to the upper surface of the sealing layer in the second region.

10. The display device of claim 1, wherein:
    the base substrate further comprises a third recess at the display region and recessed from the front surface of the base substrate, the third recess being between the module hole and the first recess in the plan view; and
    the third recess has a smaller width than that of at least one of the first recess or the second recess in the direction parallel to the front surface of the base substrate.

11. The display device of claim 10, wherein in the plan view,
    a region between the first recess and the second recess is defined as a first region,
    a region outside the second blocking recess is defined as a second region,
    a region between the first recess and the third blocking recess is defined as a third region,
    a region between the third blocking recess and the module hole is defined as a fourth region, and
    the fourth region has a smaller minimum width than those of the first region and third region in the direction parallel to the front surface of the base substrate.

12. The display device of claim 11, wherein the sealing layer covers an inner surface of the first recess, an inner surface of the second recess, the first region, and the second region.

13. The display device of claim 12, wherein the sealing layer comprises:
    a first inorganic film;
    an organic film on the first inorganic film; and
    a second inorganic film on the organic film, and
    wherein the first inorganic film and the second inorganic film are in contact with each other in the first recess, and spaced apart from each other in the second recess.

14. The display device of claim 1, wherein the base substrate comprises:
    a first base layer comprising an organic material, and configured to define the rear surface of the base substrate;
    a first barrier layer on the first base layer, the first barrier layer comprising an inorganic material, and configured to define the front surface of the base substrate;
    a second base layer between the first base layer and the first barrier layer, and comprising an organic material; and
    a second barrier layer between the first base layer and the first barrier layer, and comprising an inorganic material.

15. The display device of claim 14, wherein:
    the module hole passes through the first base layer, the second base layer, the first barrier layer, and the second barrier layer, and
    each of the first and second recesses are on the first base layer and the second barrier layer.

16. The display device of claim 15, wherein each of the first recess and the second recess comprises:
    a through part passing through the first barrier layer; and
    a recessed part overlapping with the through part of the first barrier layer, and defined in the second base layer, and
    wherein a width of the recessed part is greater than a width of the through part of the first barrier layer.

17. The display device of claim 1, wherein in the plan view, the module hole has a circular shape, and each of the first recess and the second recess has a circularly annular shape.

18. A display device comprising:
a base substrate including a front surface and a rear surface, and comprising a display region and a peripheral region adjacent to the display region in a plan view;
an organic light-emitting element on the display region of the base substrate; and
a sealing layer on the organic light-emitting element,
wherein the base substrate comprises:
- a module hole in the display region, and passing through the front surface and the rear surface of the base substrate;
- a first recess at the display region and recessed from the front surface of the base substrate, the first recess surrounding the module hole in the plan view;
a second recess at the display region and recessed from the front surface of the base substrate, the second recess surrounding the first recess in the plan view; and
- a third recess at the display region and recessed from the front surface of the base substrate, the third blocking recess being between the module hole and the first recess in the plan view, and
wherein the third recess has a smaller width than that of at least one of the first recess or the second recess in a direction parallel to the front surface of the base substrate.

19. A display device comprising:
a display panel comprising:
- a base substrate comprising a plurality of pixels;
- a front surface comprising a display region in which the pixels are located, and a peripheral region adjacent to the display region; and
- a rear surface opposite the front surface; and
an electronic component connected to the display panel,
wherein the base substrate comprises:
- a module hole in the display region, and passing through the front surface and the rear surface of the base substrate;
- a first recess at the display region and recessed from the front surface of the base substrate, the first recess surrounding the module hole in a plan view; and
- a second recess at the display region and recessed from the front surface of the base substrate, the second recess surrounding the first recess in the plan view, and
wherein the electronic component is accommodated in the module hole, and the first recess and the second recess have different widths from each other in a direction parallel to the front surface of the base substrate.

20. The display device of claim 19, wherein the electronic component comprises at least one from among any of an audio output device, an imaging device, or a light-receiving device.

* * * * *